US012813106B2

(12) United States Patent
Kim et al.

(10) Patent No.: US 12,813,106 B2
(45) Date of Patent: Nov. 24, 2026

(54) TRANSPARENT DISPLAY DEVICE WITH TOUCH SENSOR

(71) Applicant: LG Display Co., Ltd., Seoul (KR)

(72) Inventors: Dojin Kim, Paju-si (KR); Jaehee Park, Paju-si (KR); Mireum Lee, Paju-si (KR); Nara Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 343 days.

(21) Appl. No.: 18/499,806

(22) Filed: Nov. 1, 2023

(65) Prior Publication Data

US 2024/0224660 A1 Jul. 4, 2024

(30) Foreign Application Priority Data

Dec. 29, 2022 (KR) ........................ 10-2022-0188831

(51) Int. Cl.
*H10K 59/131* (2023.01)
*G06F 3/041* (2006.01)
*H10K 59/40* (2023.01)

(52) U.S. Cl.
CPC ......... *H10K 59/131* (2023.02); *G06F 3/0412* (2013.01); *H10K 59/40* (2023.02)

(58) Field of Classification Search
CPC .... H10K 59/122; H10K 59/40; H10K 59/131; H10K 59/121; G06F 3/0412; G06F 3/04164; G06F 3/0443; G06F 3/0445; G06F 3/0446
See application file for complete search history.

(56) References Cited

U.S. PATENT DOCUMENTS

2016/0349899 A1 12/2016 Hwang et al.
2017/0213873 A1* 7/2017 Bok ...................... G06F 3/0412
2018/0013081 A1* 1/2018 Chou ................ H10K 59/1216
2019/0043927 A1* 2/2019 Jang ..................... G09G 3/3233
2019/0058020 A1* 2/2019 Tsai ........................ G06F 3/044
2021/0200366 A1* 7/2021 Bok ......................... H04R 7/04
2021/0242284 A1* 8/2021 Kim ...................... G06F 3/0412
2021/0359025 A1* 11/2021 Jung ..................... C23C 14/042
2022/0093708 A1* 3/2022 Cho ...................... G06F 3/0446
2022/0165819 A1 5/2022 Park et al.
(Continued)

FOREIGN PATENT DOCUMENTS

KR 10-1679977 B1 11/2016
KR 10-2017-0089460 A 8/2017
(Continued)

*Primary Examiner* — Steven B Gauthier
*Assistant Examiner* — E. Rhett Cheek
(74) *Attorney, Agent, or Firm* — Fenwick & West LLP

(57) ABSTRACT

A transparent display device with a touch sensor is disclosed, which comprises: a substrate including a transmissive area and a non-transmissive area; a plurality of subpixels in the non-transmissive area, a subpixel including a light emitting element including an anode electrode, a light emitting layer, and a cathode electrode; a touch sensor in the transmissive area and including a touch sensor electrode in the transmissive area; a first undercut structure between the cathode electrode of the light emitting element and the touch sensor electrode of the touch sensor; a signal line between the first undercut structure and the substrate; and an etch stop layer between the signal line and the first undercut structure.

29 Claims, 16 Drawing Sheets

(56) References Cited

U.S. PATENT DOCUMENTS

| | | | | |
|---|---|---|---|---|
| 2023/0070620 | A1* | 3/2023 | Lee | H10D 86/60 |
| 2024/0211080 | A1* | 6/2024 | Lee | G06F 3/0443 |

FOREIGN PATENT DOCUMENTS

| | | | |
|---|---|---|---|
| KR | 10-2019-0015002 | A | 2/2019 |
| KR | 10-2021-0142049 | A | 11/2021 |
| KR | 10-2022-0071595 | A | 5/2022 |
| KR | 10-2022-0090750 | A | 6/2022 |

* cited by examiner

TRANSPARENT DISPLAY DEVICE WITH TOUCH SENSOR

CROSS-REFERENCE TO RELATED APPLICATION

This application claims the benefit of the Republic of Korea Patent Application No. 10-2022-0188831 filed on Dec. 29, 2022, which is hereby incorporated by reference in its entirety.

BACKGROUND

Field of Technology

The present disclosure relates to a transparent display device with a touch sensor.

Description of the Related Art

Recently, research has been conducted on a transparent display device which allows a user to see objects or items through the display device that are located on the opposite side. In a transparent display device, a display area for displaying an image can include a transmission area capable of transmitting ambient light (e.g., see-through portion) and a non-transmission area (e.g., area for the subpixels). The transparent display device can have a high light transmittance in the display area due to the transmission area.

A transparent display device may be provided with a plurality of touch sensors and a plurality of touch lines to implement a touch function. However, the transparent display device has problems in that it is not easy to form the plurality of touch sensors and the plurality of touch lines or a process is complicated and light transmittance may be reduced due to the plurality of touch sensors and the plurality of touch lines.

SUMMARY

The present disclosure has been made in view of the above problems and it is an object of the present disclosure to provide a transparent display device that may reduce loss of light transmittance due to a touch sensor and a touch line.

It is another object of the present disclosure to provide a transparent display device that may detect a defective touch sensor of a plurality of touch sensors provided in a touch block.

It is other object of the present disclosure to provide a transparent display device that may prevent a short defect from occurring in an undercut area.

In addition to the objects of the present disclosure as mentioned above, additional objects and features of the present disclosure will be clearly understood by those skilled in the art from the following description of the present disclosure.

In one embodiment, a transparent display device comprising: a substrate including a transmissive area and a non-transmissive area that is less transmissive of external light than the transmissive area; a plurality of subpixels in the non-transmissive area, a subpixel from the plurality of subpixels including a light emitting element that comprises an anode electrode, a light emitting layer on the anode electrode, and a cathode electrode on the light emitting layer; a touch sensor in the transmissive area, the touch sensor including a touch sensor electrode in the transmissive area; a first undercut structure between the cathode electrode of the light emitting element and the touch sensor electrode of the touch sensor such that the cathode electrode is disconnected from the touch sensor electrode; a signal line between the first undercut structure and the substrate; and an etch stop layer between the signal line and the first undercut structure.

In one embodiment, a transparent display device comprises: a substrate including a transmissive area and a non-transmissive area that is less transmissive of external light than the transmissive area; a plurality of insulating layers in the non-transmissive area and the transmissive area, the plurality of insulating layers including an opening in the non-transmissive area; a light emitting element on the plurality of insulating layers in the non-transmissive area, the light emitting element including an anode electrode, an organic light emitting layer on the anode electrode, and a cathode electrode on the organic light emitting layer, the cathode electrode extending from the non-transmissive area to the opening in the plurality of insulating layers in the non-transmissive area; a touch sensor including a touch sensor electrode that is on the plurality of insulating layers in the transmissive area, the touch sensor electrode extending to the opening in the plurality of insulating layers in the non-transmissive area; an etch stop layer in the opening; an undercut structure at least partially on the etch stop layer in the opening, the undercut structure separating the touch sensor electrode in the opening from the cathode electrode in the opening; and a signal line that is between the etch stop layer and the substrate and at least partially overlaps the opening.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
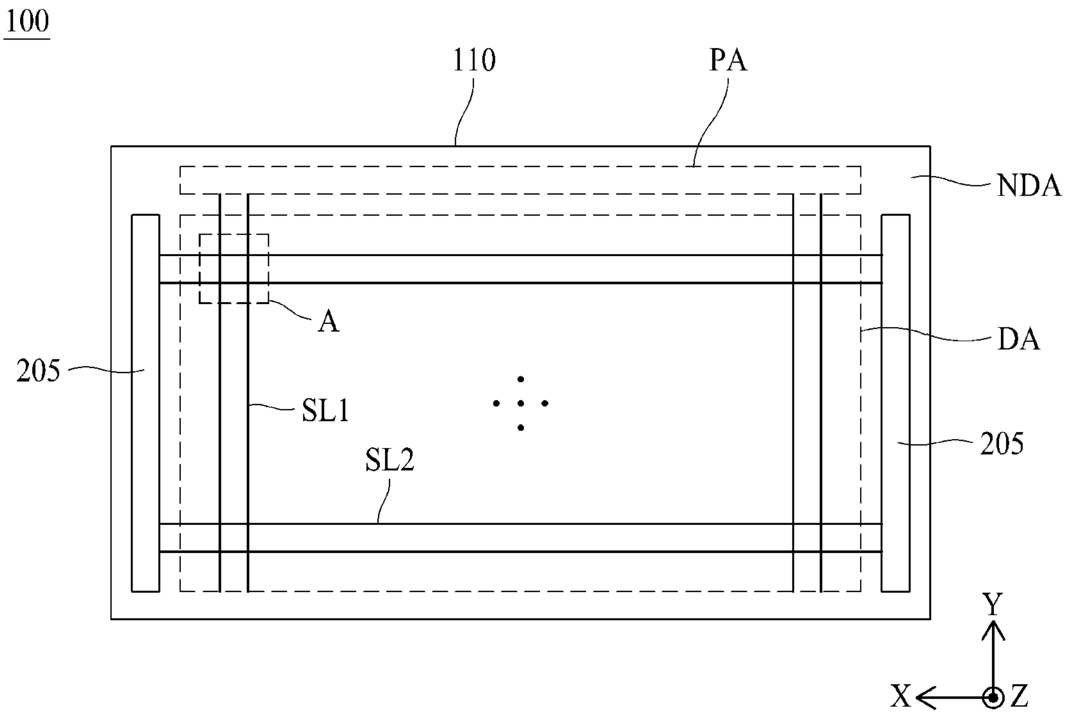
FIG. 1 is a schematic plan view illustrating a transparent display panel according to one embodiment.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, dimensions (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a situation where "comprise," "have," and "include" described in the present specification are used, another part can be added unless "only" is used. The terms of a singular form can include plural forms unless referred to the contrary.

In construing an element, the element is construed as including an error range although there is no explicit description.

In describing a position relationship, for example, when the position relationship is described as "upon~," "above~," "below," and "next to," one or more portions can be arranged between two other portions unless "just" or "direct" is used.

It will be understood that, although the terms "first," "second," etc., can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., can be used. These terms are intended to identify the corresponding elements from the other elements, and basis, order, or number of the corresponding elements are not limited by these terms. The expression that an element is "connected" or "coupled" to another element should be understood that the element can directly be connected or coupled to another element but can directly be connected or coupled to another element unless specially mentioned, or a third element can be interposed between the corresponding elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship and are combinable.

FIG. 1 is a schematic plan view illustrating a transparent display panel according to one embodiment.

Hereinafter, the X axis indicates a line parallel with a scan line, the Y axis indicates a line parallel with a data line, and the Z axis indicates a height direction of a transparent display device 100.

Referring to FIG. 1, a transparent display device according to one embodiment of the present disclosure includes a transparent display panel 110. The transparent display panel 110 can include a display area DA provided with pixels to display an image, and a non-display area NDA that does not display an image.

The display area DA can be provided with first signal lines SL1, second signal lines SL2 and the pixels. The non-display area NDA can be provided with a pad area PA in which pads are disposed, and at least one gate driver 205.

The first signal lines SL1 can be extended in a first direction (e.g., Y-axis direction). The first signal lines SL1 can cross the second signal lines SL2 in the display area DA. The second signal lines SL2 can be extended in the display area DA in a second direction (e.g., X-axis direction). The pixel can be provided in an area where at least one of the first signal line SL1 and the second signal line SL2 is provided, and emits predetermined light to display an image.

The gate driver 205 are connected to the scan lines and supplies scan signals to the scan lines. The gate driver 205 can be disposed in the non-display area NDA on one side or both sides of the display area DA of the transparent display panel 110 by a gate driver in panel (GIP) method or a tape automated bonding (TAB) method.

The transparent display panel 110 can further include a touch line and a touch sensor in addition to the first signal line SL1, the second signal line SL2 and the pixel in order to implement a touch function. A detailed description of the touch line and the touch sensor will be described later with reference to FIGS. 2 to 9.

Figure 2:
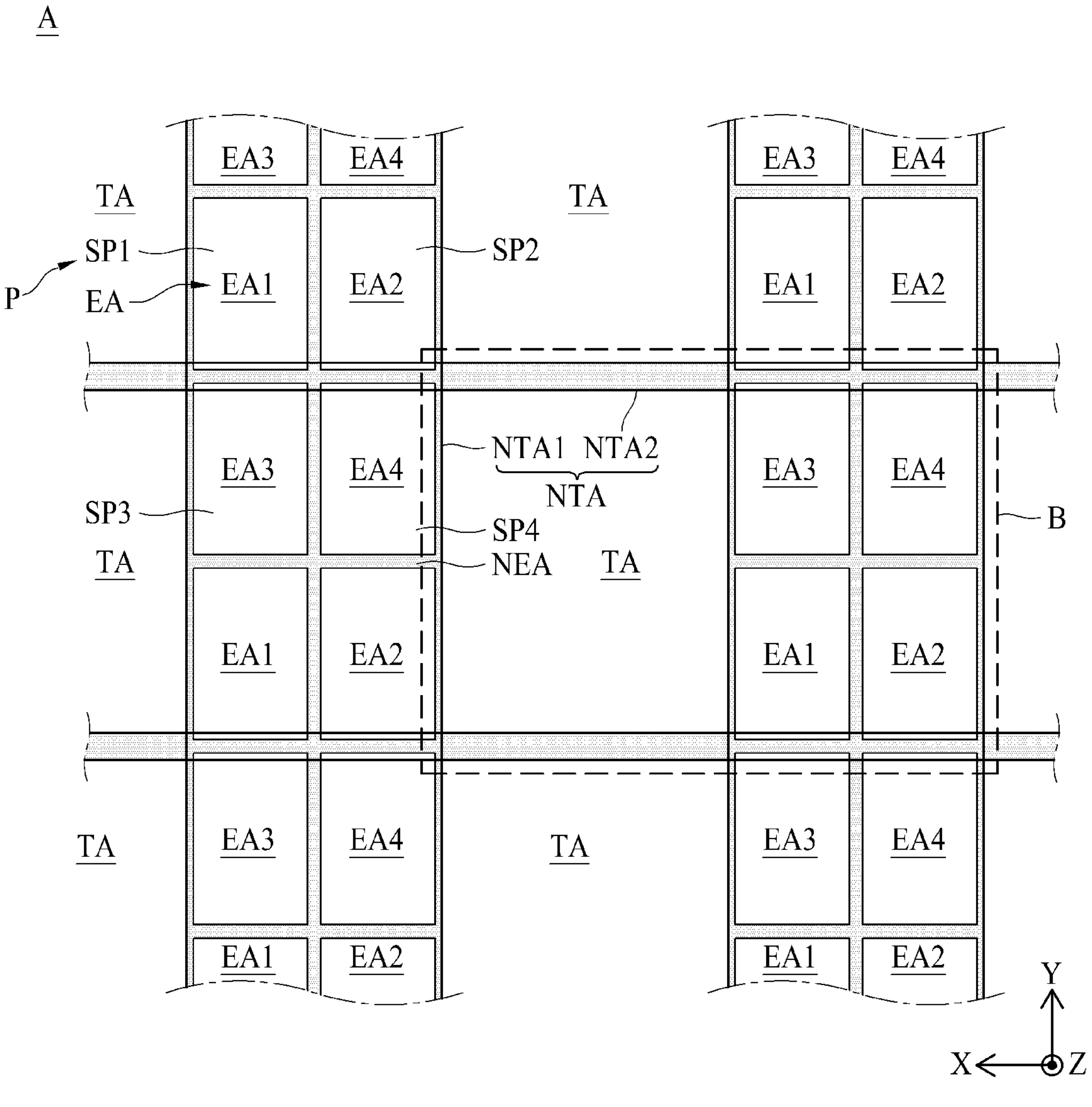
FIG. 2 is a schematic view illustrating an example of a pixel provided in an area ‘A’ of FIG. 1 according to one embodiment.
Figure 3:
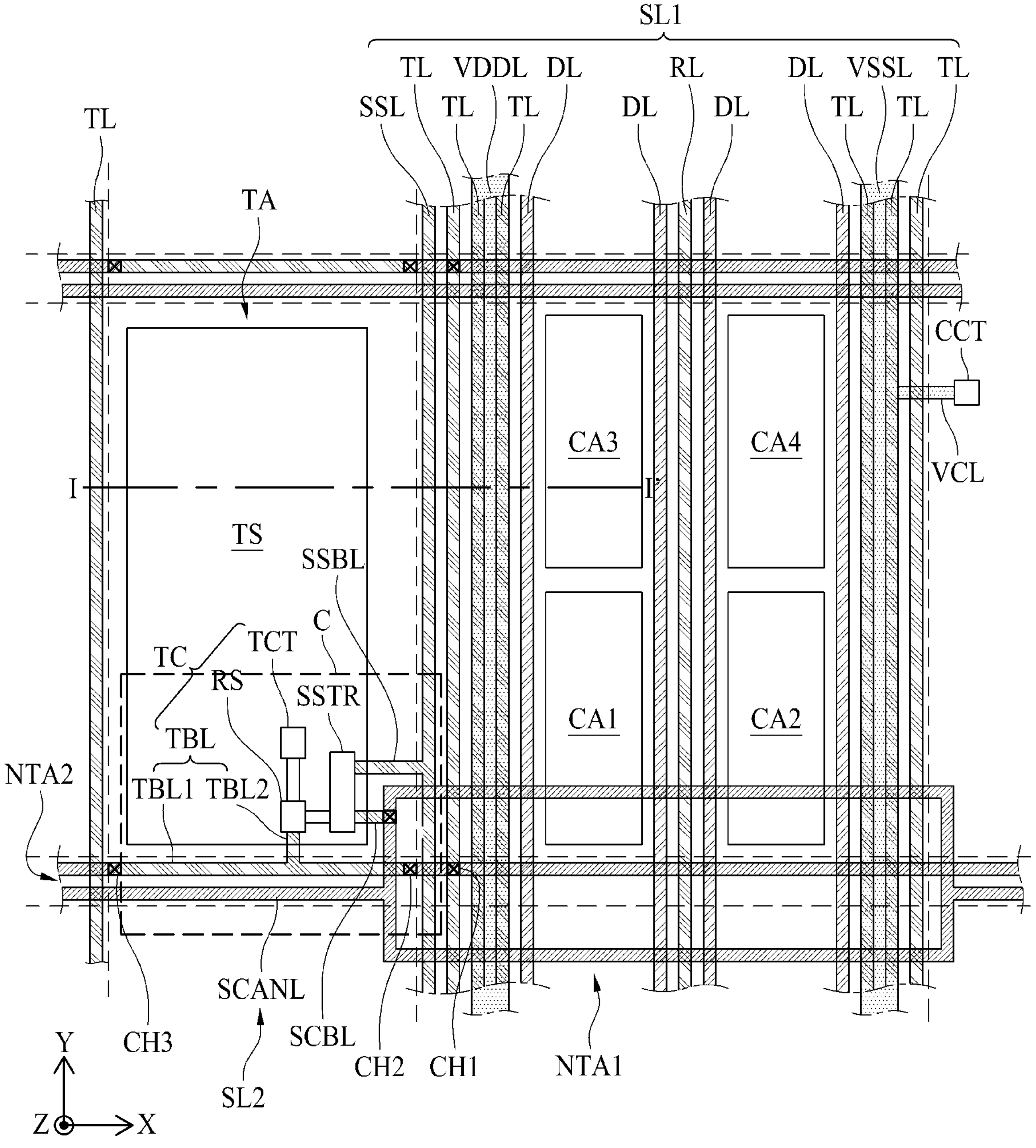
FIG. 3 is a view illustrating an example of signal lines, touch lines and a touch sensor, which are provided in an area ‘B’ of FIG. 2 according to one embodiment.

FIG. 2 is a schematic view illustrating an example of a pixel provided in an area 'A' of FIG. 1 according to one embodiment, and FIG. 3 is a view illustrating an example of signal lines, touch lines and a touch sensor, which are provided in an area 'B' of FIG. 2 according to one embodiment.

The display area DA, as shown in FIG. 2, includes a transmissive area TA and a non-transmissive area NTA. The transmissive area TA is an area in which most of the externally incident light passes through, and the non-transmissive area NTA is an area through which most of the externally incident light fails to transmit through. Thus, the transmissive area TA has greater light transmittance of external light that is incident on the display area DA than the non-transmissive area NTA. For example, the transmissive area TA can be an area where light transmittance is greater than α %, and the non-transmissive area NTA can be an area where light transmittance is less than β %, where α is greater than β. A user can view an object or background arranged at a rear surface of the transparent display panel 110 (e.g., behind the display panel) due to the transmissive area TA.

The non-transmissive area NTA can include a first non-transmissive area NTA1, a second non-transmissive area NTA2, and a plurality of pixels P. Pixels P can be provided to at least partially overlap with at least one of the first signal line SL1 and the second signal line SL2, thereby emitting predetermined light to display an image. A light emission area EA can correspond to an area, from which light is emitted, in the pixel P.

Each of the pixels P, as shown in FIG. 2, can include at least one of a first subpixel SP1, a second subpixel SP2, a third subpixel SP3, and a fourth subpixel SP4. The first subpixel SP1 can include a first light emission area EA1 emitting light of a first color. The second subpixel SP2 can include a second light emission area EA2 emitting light of a second color. The third subpixel SP3 can include a third light emission area EA3 emitting light of a third color. The fourth subpixel SP4 can include a fourth light emission area EA4 emitting light of a fourth color.

The first to fourth light emission area EA1, EA2, EA3 and EA4 can emit light of different colors. For example, the first light emission area EA1 can emit light of a green color. The second light emission area EA2 can emit light of a red color. The third light emission area EA3 can emit light of a blue color. The fourth light emission area EA4 can emit light of a white color. However, the light emission areas are not limited to this example. Also, the arrangement order of the subpixels SP1, SP2, SP3 and SP4 can be changed in various ways.

The first non-transmissive area NTA1 can be extended in a first direction (e.g., Y-axis direction) in a display area DA, and can be disposed to at least partially overlap light emission areas EA1, EA2, EA3 and EA4. A plurality of first non-transmissive areas NTA1 can be provided in the transparent display panel 110, and the transmissive area TA can be provided between two adjacent first non-transmissive areas NTA1. In the first non-transmissive area NTA1, first signals lines SL1 that extend in the first direction (e.g., Y-axis direction) can be disposed to be spaced apart from each other.

For example, the first signal lines SL1 can include at least one of a pixel power line VDDL, a common power line VSSL, a reference line RL, and data lines DL as shown in FIG. 3.

The pixel power line VDDL can supply a first power source to a driving transistor DTR of each of subpixels SP1, SP2, SP3 and SP4 provided in the display area DA.

The common power line VSSL can supply a second power source to a cathode electrode of the subpixels SP1, SP2, SP3 and SP4 provided in the display area DA. At this time, the second power source can be a common power source commonly supplied to the subpixels SP1, SP2, SP3 and SP4.

The common power line VSSL can supply the second power source to the cathode electrode through a cathode contact electrode CCT. The cathode contact electrode CCT can be provided between the transmissive area TA and the common power line VSSL. A power connection line VCL can be disposed between the common power line VSSL and the cathode contact electrode CCT. One end of the power connection line VCL can be connected to the common power line VSSL and the other end thereof can be connected to the cathode contact electrode CCT. The cathode electrode can be connected to the cathode contact electrode CCT. As a result, the cathode electrode can be electrically connected to the common power line VSSL through the power connection line VCL and the cathode contact electrode CCT.

The reference line RL can supply an initialization voltage (or reference voltage) to the driving transistor DTR of each of the subpixels SP1, SP2, SP3 and SP4 provided in the display area DA. The reference line RL can be disposed between the plurality of data lines DL. For example, the reference line RL can be disposed at the center of the four data lines DL, that is, between the second data line DL and the third data line DL.

The reference line RL can be diverged and connected to the plurality of subpixels SP1, SP2, SP3 and SP4. In detail, the reference line RL can be connected to circuit elements of the plurality of subpixels SP1, SP2, SP3 and SP4 to supply an initialization voltage (or reference voltage) to each of the subpixels SP1, SP2, SP3 and SP4.

Each of the data lines DL can supply a data voltage to the subpixels SP1, SP2, SP3 and SP4. For example, one data line DL can supply a first data voltage to a first driving transistor of the first subpixel SP1, the other data line DL can supply a second data voltage to a second driving transistor of the second subpixel SP2. Another data line DL can supply a third data voltage to a third driving transistor of the third subpixel SP3 and another data line DL can supply a fourth data voltage to a fourth driving transistor of the fourth subpixel SP4.

The first signal lines SL1 can further include touch lines TL and sensing lines SSL. In the transparent display panel 110 according to one embodiment of the present disclosure, the touch line TL can be further disposed in the first non-transmissive area NTA1. At least two touch lines TL can be provided in the first non-transmissive area NTA1. When the plurality of touch lines TL are disposed in the transmissive area TA of the transparent display panel 110, light transmittance may be deteriorated or impaired due to the plurality of touch lines TL.

Also, a slit, specifically an elongated linear or rectangular shape, can be provided between the plurality of touch lines TL. When external light passes through the slit, a diffraction phenomenon can occur. According to the diffraction phenomenon, light corresponding to plane waves can be changed to spherical waves as the light passes through the slit, and an interference phenomenon can occur in the spherical waves. Therefore, constructive interference and destructive interference occur in the spherical waves, whereby the external light that has passed through the slit can have irregular light intensity. As a result, in the transparent display panel 110, the definition or clarity of an object or image positioned at an opposite side may be reduced or impaired (e.g., it may appear slightly fuzzy or cloudy). For this reason, there are some technical benefits to dispose the plurality of touch lines TL in the first non-transmissive area NTA1 rather than the transmissive area TA.

A plurality of touch lines TL can be disposed between first signal lines SL1 in the first non-transmissive area NTA1 and a transmissive area TA as shown in FIG. 3. For example, six touch lines TL can be disposed in one first non-transmissive area NTA1. Three touch lines TL can be disposed between the circuit areas CA1, CA2, CA3 and CA4 and the transmissive area TA disposed on the right of the circuit areas CA1, CA2, CA3 and CA4. The other three touch lines TL can be disposed between the circuit areas CA1, CA2, CA3 and CA4 and the transmissive area TA disposed on the left of the circuit areas CA1, CA2, CA3 and CA4, but are not limited to this arrangement. The plurality of touch lines TL are formed to not overlap (i.e., non-overlapping) with circuit areas CA1, CA2, CA3 and CA4 in which circuit elements are disposed, and various modifications can be made in the arrangement order of the plurality of touch lines TL with the first signal lines SL1.

In addition, the sensing line SSL can be further disposed in the first non-transmissive area NTA1. In more detail, the sensing line SSL detects whether a short-circuit occurs between a cathode electrode of a light emitting element and a touch sensor electrode of a touch sensor TS. Further, the sensing line SSL can sense a voltage applied to the touch sensor electrode of the touch sensors TS through a sensing transistor SSTR.

In addition, the sensing line SSL can be disposed to be adjacent to the transmissive area TA in the first non-transmissive area NTA1. In more detail, the sensing line SSL can be disposed between the touch lines TL and the transmissive area TA.

Further, the transparent display panel 110 includes a pixel P between adjacent transmissive areas TA. In particular, the pixel P can include light emission areas EA1, EA2, EA3 and EA4 in which a light emitting element is disposed to emit light. Because the non-transmissive area NTA in the transparent display panel 110 has a small area, a circuit element can be disposed to at least partially overlap the light emission areas EA1, EA2, EA3 and EA4.

Further, the touch lines TL do not overlap the circuit areas CA1, CA2, CA3 and CA4, whereby a parasitic capacitance of the touch lines TL due to the circuit elements can be reduced or minimized. Also, the transparent display panel 110 according to an embodiment of the present disclosure can reduce a horizontal distance difference between the touch lines TL and improve uniformity of the parasitic capacitance.

In addition, the second non-transmissive area NTA2 extends in the display area DA in a second direction (e.g., X-axis direction), and can be disposed to at least partially overlap the light emission areas EA1, EA2, EA3 and EA4. A plurality of second non-transmissive areas NTA2 can be provided in the transparent display panel 110, and the transmissive area TA can be provided between two adjacent second non-transmissive areas NTA2. Also, the second signal line SL2 can be disposed in the second non-transmissive area NTA2.

As shown in FIG. 3, the second signal line SL2 extends in a second direction (e.g., X-axis direction), and can include, for example, a scan line SCANL. The scan line SCANL can supply a scan signal to subpixels SP1, SP2, SP3 and SP4 of the pixel P, or supply the scan signal to the sensing transistor SSTR.

In addition, the second signal line SL2 can further include a touch bridge line TBL. The touch bridge line TBL can connect any one of the touch lines TL with a touch sensor TS. The touch bridge line TBL can be connected to any one of the touch lines TL through a first contact hole CH1. The touch bridge line TBL can be connected to at least two touch sensors TS arranged in the second direction (e.g., X-axis direction) while extending in the second direction (e.g., X-axis direction).

Further, the touch lines TL can be disposed in the first non-transmissive area NTA1 that is not the second non-transmissive area NTA2, whereby the light transmittance can be prevented from being deteriorated due to the touch lines TL. In addition, as shown in FIG. 3, the second non-transmissive area NTA2 extended in the second direction (e.g., X-axis direction) crosses between adjacent transmissive areas TA. Also, when a width of the second non-transmissive area NTA2 crossing the transmissive areas TA is increased, a size of the transmissive area TA is reduced.

In addition, when the touch lines TL are disposed in the second non-transmissive area NTA2, the width of the second non-transmissive area NTA2 is increased to include a larger number of lines, and the size of the transmissive area TA is reduced. Thus, the light transmittance of the transparent display panel 110 is reduced due to the touch lines TL.

Further, in one embodiment, the touch lines TL are disposed in the first non-transmissive area NTA1, and only one touch bridge line TBL for connecting the touch sensors TS is provided in the second non-transmissive area NTA2. Therefore, the transparent display panel 110 according to one embodiment of the present disclosure can reduce or minimize the decrease in size of the transmissive area TA or decrease in light transmittance due to the touch lines TL and the touch bridge line TBL.

In addition, the touch sensor TS is provided in the transmissive area TA. In more detail, the touch sensor TS can be disposed in each transmissive area TA, and changes in capacitance during a user contact. A touch driver is also connected to the touch sensors TS through the touch lines TL to detect a change in the capacitance of the touch sensors TS. The touch sensors TS can also correspond to the pixels P in a one-to-one correspondence.

Hereinafter, a connection relationship among touch sensors TS, touch lines TL and touch bridge lines TBL will be described in more detail with reference to FIGS. 4 and 5. In particular, FIG. 4 is a view illustrating a connection relationship between a plurality of touch blocks and a plurality of touch lines according to one embodiment, and FIG. 5 is a view illustrating a connection relationship between a plurality of touch lines and a plurality of touch sensors in one touch block according to one embodiment.

Figure 4:
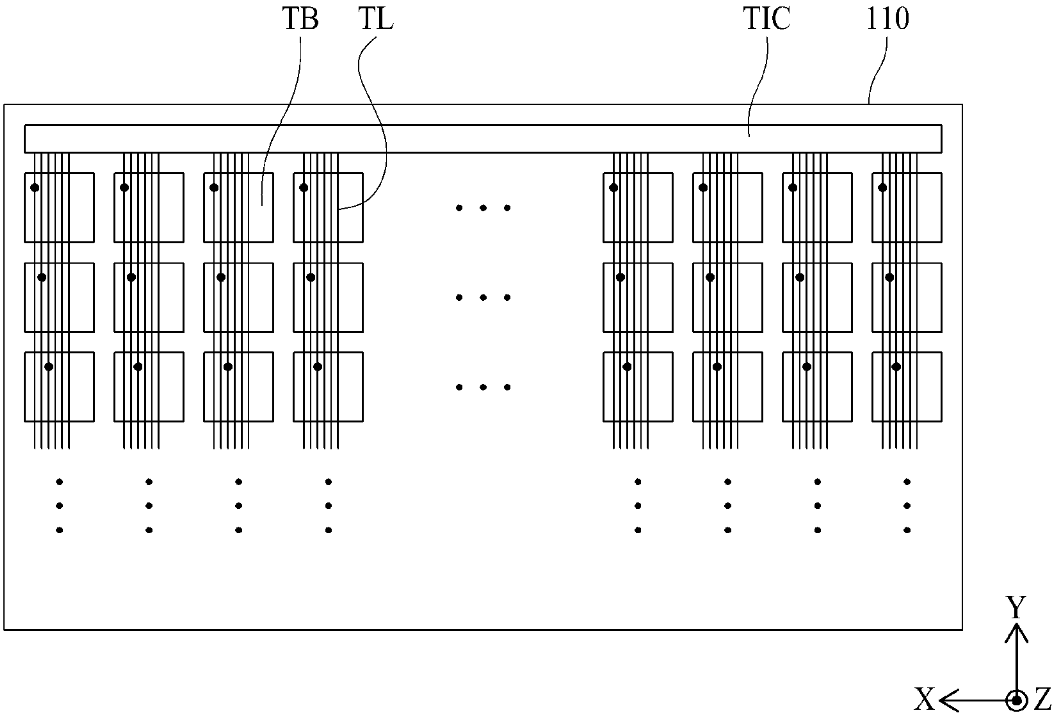
FIG. 4 is a view illustrating a connection relation between a plurality of touch blocks and a plurality of touch lines according to one embodiment.
Figure 5:
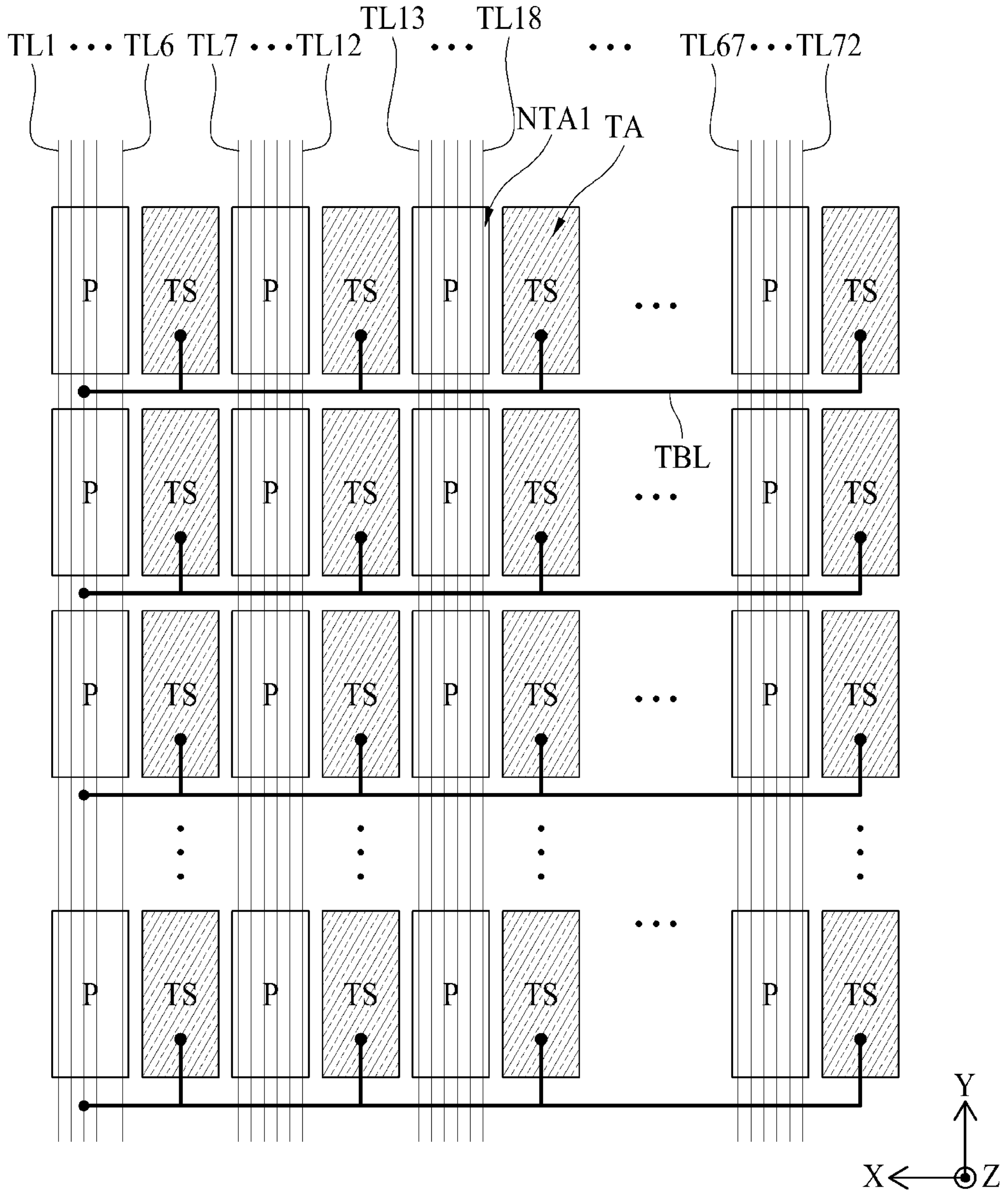
FIG. 5 is a view illustrating a connection relation between a plurality of touch lines and a plurality of touch sensors in one touch block according to one embodiment.

Referring to FIGS. 4 and 5, the transparent display panel 110 includes a plurality of touch blocks TB. Each touch block TB includes a plurality of pixels P and a plurality of transmissive areas TA disposed to correspond to the pixels P one-to-one as a basic unit for determining a user touch position.

The transparent display panel 110 also includes touch sensors TS provided in each transmissive area TA. For example, each touch block TB can include 12×15 pixels P and 12×15 touch sensors TS. In this instance, when the image resolution is 1920×1080, the touch resolution can be 160×72.

Further, as each touch line TL is connected to one of the touch blocks TB, a change in capacitance of the touch sensors TS provided in the connected touch block TB can be sensed. That is, the touch lines TL provided in the transparent display panel 110 can correspond to the touch blocks TB in a one-to-one manner. Therefore, the number of touch lines TL can be the same as the number of touch blocks TB in the transparent display panel 110. For example, when the number of touch blocks TB is 160×27, the touch line TL can also be 160×72, and can be connected to the touch driver TIC.

As described above, to form the touch lines TL as much as the number of touch blocks TB, at least two touch lines TL are provided in one first non-transmissive area NTA1. For example, when an image resolution is 1920×1080 and touch resolution is 160×72, six touch lines TL can be provided in one first non-transmissive area NTA1, as shown in FIG. 3, to form 160×72 touch lines TL in the transparent display panel 110.

As shown in FIG. 5, the touch sensors TS provided in one touch block TB can be connected to one of the touch lines TL provided in one touch block TB. For example, twelve first non-transmissive areas NTA1 can be provided in one touch block TB, and six touch lines TL can be disposed in each of the twelve first non-transmissive areas NTA1. As a result, one touch block TB can be provided with 72 touch lines TL1, . . . , TL72. In this instance, the touch sensors TS provided in one touch block TB can be connected to one specific touch line TL of the 72 touch lines TL1, . . . , TL72. In addition, the specific touch line TL can be connected to the touch sensors TS arranged in the second direction (e.g., X-axis direction) through the touch bridge lines TBL extending in the second direction (e.g., X-axis direction). As a result, the touch sensors TS provided in one touch block TB can be electrically connected to each other through the specific touch line TL and the touch bridge lines TBL.

In addition, each touch line TL can correspond to the touch blocks TB in a one-to-one manner. Therefore, the touch blocks TB are connected to different touch lines TL and thus can be electrically separated from each other. Further, each touch line TL can connect a plurality of touch sensors TS provided in a corresponding touch block TB to a touch driver TIC. In more detail, each touch line TL can transmit the changed capacitance provided from the touch sensors TS in the touch block TB to the touch driver TIC. The touch driver TIC can thus sense the changed capacitance, and can determine a user touch position. Also, each touch line TL can provide the touch sensing voltage generated from the touch driver TIC to the touch sensors TS provided in the touch block TB.

Next, the light emitting elements of the light emission areas EA, and the touch sensors TS of the transmissive area TA will be described in more detail with reference to FIG. 6. In particular, FIG. 6 is a cross-sectional view illustrating an example of line I-I' of FIG. 3 according to one embodiment.

Figure 6:
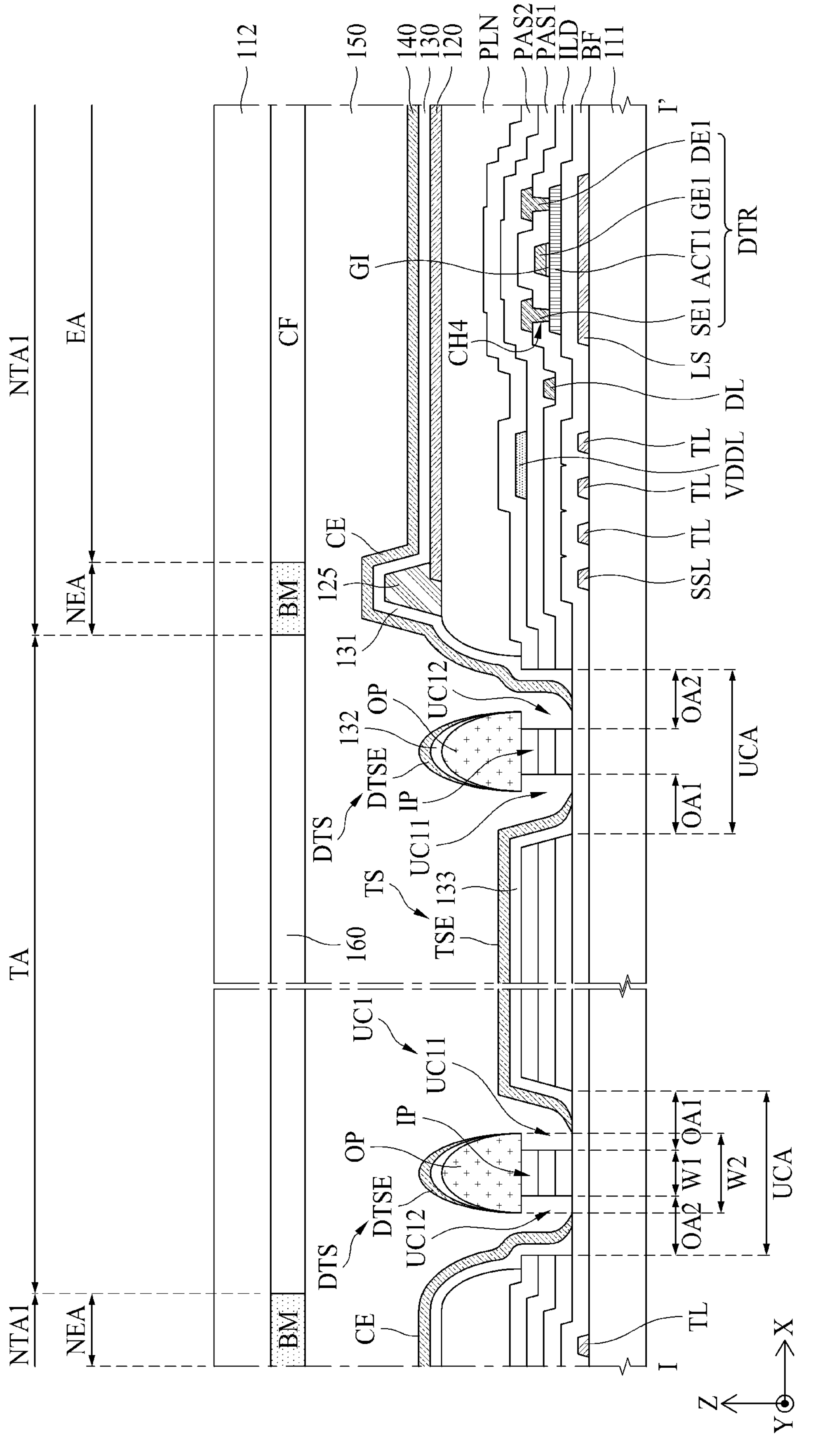
FIG. 6 is a cross-sectional view illustrating an example of line I-I' of FIG. 3 according to one embodiment.

Referring to FIGS. 3 and 6, the first substrate 111 can include transmissive areas TA and a non-transmissive area NTA including light emission area EA disposed between adjacent transmissive areas TA. The non-transmissive area NTA can include a first non-transmissive area NTA1 extending in the first direction (e.g., Y-axis direction) and a second non-transmissive area NTA2 extending in the second direction (e.g., X-axis direction).

The first non-transmissive area NTA1 includes circuit areas CA1, CA2, CA3 and CA4 in which at least one transistor and a capacitor are disposed. In addition, the first non-transmissive area NTA1 can include a pixel power line VDDL, a common power line VSSL, a reference line RL, data lines DL, touch lines TL, sensing lines SSL extending in the first direction (e.g., Y-axis direction) and not overlapping the circuit areas CA1, CA2, CA3 and CA4. The second non-transmissive area NTA2 can include a scan line SCANL and a touch bridge line TBL extending in the second direction (e.g., X-axis direction).

The at least one transistor can include a driving transistor DTR and switching transistors. In particular, the switching transistor is switched in accordance with a scan signal supplied to the scan line SCANL to charge a data voltage supplied from the data line DL in the capacitor. In addition, the driving transistor DTR is switched in accordance with the data voltage charged in the capacitor to generate a data current from a power source supplied from the pixel power line VDDL and to supply the data current to a first electrode layer 120 of the subpixels SP1, SP2, SP3 and SP4. The driving transistor DTR also includes an active layer ACT1, a gate electrode GE1, a source electrode SE1, and a drain electrode DE1.

In more detail, as shown in FIG. 6, a light shielding layer LS is provided on a first substrate 111. The light shielding layer LS shields external light incident on the active layer ACT1 in an area in which the driving transistor DTR is provided. The light shielding layer LS can include a single layer or multi-layer made of any one of molybdenum (Mo), aluminum (Al), chromium (Cr), gold (Au), titanium (Ti), nickel (Ni), neodymium (Nd) or copper (Cu), or their alloy.

Further, at least a portion of the pixel power line VDDL, the common power line VSSL, the reference line RL, the data lines DL, the touch lines TL, the touch bridge line TBL and the sensing line SSL can be formed in the same layer as the light shielding layer LS. For example, the reference line RL, the touch lines TL, the touch bridge line TBL and the sensing line SSL can include the same material as that of the light shielding layer LS in the same layer as the light shielding layer LS, but are not limited thereto.

A buffer layer BF can be provided over the light shielding layer LS. and the buffer layer BF protects the transistors DTR from water permeated through the first substrate 111, which is vulnerable to water permeation, and can include an inorganic layer, for example, a silicon oxide layer (SiOx), a silicon nitride layer (SiNx) or a multi-layer of the silicon oxide layer and the silicon nitride layer.

An active layer ACT1 of the driving transistor DTR can be provided over the buffer layer BF. In particular, the active layer ACT1 can include a silicon-based semiconductor material or an oxide-based semiconductor material. For example, the active layer ACT1 can include Indium Gallium Zinc Oxide IGZO. The active layer ACT1 can also include a multi-layer such as a first layer formed of a silicon-based semiconductor material or an oxide-based semiconductor material, and a second layer formed of ITO or IZO. For example, the active layer ACT1 of the driving transistor DTR can include a first layer made of Indium Gallium Zinc Oxide IGZO and a second layer made of IZO.

In addition, a gate insulating layer GI can be provided over the active layer ACT1 of the driving transistor DTR. In particular, the gate insulating layer GI can be provided in a pattern in the area where a gate electrode GE1 of the driving transistor DTR is disposed. The gate insulating layer GI can include an inorganic layer, for example, a silicon oxide layer (SiOx), a silicon nitride layer (SiNx) or a multi-layer of the silicon oxide layer and the silicon nitride layer.

Also, as shown in FIG. 6, the gate electrode GE1 of the driving transistor DTR can be provided over the gate insulating layer GI. The gate electrode GE1 can include a single layer or multi-layer made of one of molybdenum (Mo), aluminum (Al), chromium (Cr), gold (Au), titanium (Ti), nickel (Ni), neodymium (Nd) and copper (Cu), or their alloy.

An interlayer insulating layer ILD can be provided over the gate electrode GE1 of the driving transistor DTR. The interlayer insulating layer ILD can be provided in the non-transmissive area NTA and the transmissive area TA.

However, to form a first undercut structure UC1 in the transmissive area TA, the interlayer insulating layer ILD includes an opened area, which exposes the buffer layer BF, without being provided in at least a portion of the transmissive area TA.

As an example, one or a plurality of first undercut structures UC1 can be provided. For example, the interlayer insulating layer ILD can include one opening area OA1 to form one undercut UC11 by using the first undercut structure UC1. Alternatively, the interlayer insulating layer ILD can include two or more opening areas OA1 and OA2 to form at least two or more undercuts UC11 and UC12 by using the first undercut structure UC1.

In the following description, for convenience of description, as shown in FIG. 6, the interlayer insulating layer ILD can include a first opening area OA1 and a second opening area OA2 in the transmissive area TA to form two undercuts UC11 and UC12, but the present disclosure is not limited thereto. The interlayer insulating layer ILD can include an inorganic layer, for example, a silicon oxide layer (SiOx), a silicon nitride layer (SiNx) or their multi-layer.

In addition, a source electrode SE1 and a drain electrode DE1 of the driving transistor DTR can be disposed over the interlayer insulating layer ILD. In more detail, the source electrode SE1 and the drain electrode DE1 can be connected to the active layer ACT1 of the driving transistor DTR through a fourth contact hole CH4 passing through the interlayer insulating layer ILD. Also, the source electrode SE1 and the drain electrode DE1 can include a single layer or multi-layer made of any one of molybdenum (Mo), aluminum (Al), chromium (Cr), gold (Au), titanium (Ti), nickel (Ni), neodymium (Nd) and copper (Cu) or their alloy.

Further, at least a portion of the pixel power line VDDL, the common power line VSSL, the reference line RL, the data lines DL, the touch lines TL, the touch bridge line TBL and the sensing line SSL can be provided on the same layer as the source electrode SE1 and the drain electrode DE1 of the driving transistor DTR. For example, the data lines DL can include the same material on the same layer as the source electrode SE1 and the drain electrode DE1, but are not limited thereto.

In addition, as shown in FIG. 6, a first passivation layer PAS1 for insulating the driving transistor DTR can be provided over the source electrode SE1 and the drain electrode DE1 of the driving transistor DTR. The first passivation layer PAS1 can be provided in the non-transmissive area NTA and the transmissive area TA. However, to form the first undercut structure UC1 in the transmissive area TA, the first passivation layer PAS1 can be provided with an opening area exposing the buffer layer BF, without being provided in at least a portion of the transmissive area TA.

In more detail, the first passivation layer PAS1 can be provided with a first opening area OA1 and a second opening area OA2, which expose the buffer layer BF without being provided in at least a portion of the transmissive area TA, to form two undercuts UC11 and UC12 by using the first undercut structure UC1 in the transmissive area TA. The first opening area OA1 of the first passivation layer PAS1 can at least partially overlap the first opening area OA1 of the interlayer insulating layer ILD. The second opening area OA2 of the first passivation layer PAS1 can at least partially overlap the second opening area OA2 of the interlayer insulating layer ILD. The first passivation layer PAS1 can include an inorganic layer, for example, a silicon oxide layer (SiOx), a silicon nitride layer (SiNx) or their multi-layer.

A clad layer can be provided over the first passivation film PAS1. At least a portion of the pixel power line VDDL, the common power line VSSL, the reference line RL, the data lines DL, the touch lines TL, the touch bridge line TBL and the sensing line SSL may be provided on the same layer as the clad layer. For example, the pixel power line VDDL and the common power line VSSL can be provided over the first passivation layer PAS1.

The clad layer can include a single layer or multi-layer made of any one of molybdenum (Mo), aluminum (Al), chromium (Cr), gold (Au), titanium (Ti), nickel (Ni), neodymium (Nd) and copper (Cu) or their alloy. For example, the clad layer can include an alloy of molybdenum (Mo) and titanium (Ti) or a stacked structure of an alloy of molybdenum (Mo) and titanium (Ti) and ITO.

A second passivation layer PAS2 can be provided over the clad layer. The second passivation layer PAS2 can be provided in the non-transmissive area NTA and the transmissive area TA. However, in order to form the first undercut structure UC1 in the transmissive area TA, the second passivation layer PAS2 may be provided with an opening area, which exposes the buffer layer BF, without being provided in at least a portion of the transmissive area TA.

In more detail, the second passivation layer PAS2 can be provided with a first opening area OA1 and a second opening area OA2, which expose the buffer layer BF, without being provided in at least a portion of the transmissive area TA, to form two undercuts UC11 and UC12 by using the first undercut structure UC1 in the transmissive area TA. The first opening area OA1 of the second passivation layer PAS2 can at least partially overlap the first opening area OA1 of the first passivation layer PAS1 and the first opening area OA1 of the interlayer insulating layer ILD, and the second opening area OA2 of the second passivation layer PAS2 can at least partially overlap the second opening area OA2 of the first passivation layer PAS1 and the second opening area OA2 of the interlayer insulating layer ILD. The second passivation layer PAS2 can include an inorganic layer, for example, a silicon oxide layer (SiOx), a silicon nitride layer (SiNx) or their multi-layer. Thus, the first and second opening areas OA1 and OA2 (e.g., an opening) are through a thickness (e.g., the entire thickness) of a plurality of inorganic layers in the transmissive area such as the interlayer insulating layer ILD, the first passivation layer PAS1, and the second passivation layer PAS2. The first and second opening areas OA1 and OA2 result in the formation of the plurality of inorganic patterns IP disposed between the first and second opening areas OA1 and OA2. In one embodiment, the first opening OA1 is at a first side of the inorganic patterns IP and the second opening OA2 is at a second side of the inorganic patterns IP.

A planarization layer PLN for planarizing a step difference due to the driving transistor DTR and the signal lines is also provided over the second passivation layer PAS2. The planarization layer PLN can be provided in the non-transmissive area NTA, and may not be provided in at least a portion of the transmissive area TA. The planarization layer PLN can suppress a transparency by inducing refraction or the like of transmitted light. Therefore, the transparent display panel 110 according to one embodiment of the present disclosure can increase the transparency by removing a portion of the planarization layer PLN in the transmissive area TA. The planarization layer PLN can also include an organic layer such as acryl resin, epoxy resin, phenolic resin, polyamide resin, polyimide resin or the like.

In the transparent display panel 110 according to one embodiment of the present disclosure, the first undercut structure UC1 may be formed using the planarization layer PLN and a plurality of inorganic insulating layers, for example, the first and second passivation layers PAS1 and PAS2 and the interlayer insulating layer ILD.

In detail, the first undercut structure UC1 can include a plurality of inorganic insulating patterns IP having a first width W1 and an organic insulating pattern OP (e.g., an organic pattern) having a second width W2 that is wider than the first width W1. At this time, each of the plurality inorganic insulating patterns IP can be a pattern formed of the same material on the same layer as each of the first and second passivation layers PAS1 and PAS2 and the interlayer insulating layer ILD, and the organic insulating pattern OP can be a pattern formed of the same material on the same layer as the planarization layer PLN. In one embodiment, the plurality of inorganic insulating patterns IP are disposed in an opening that is through a thickness of the plurality of insulating layers (e.g., ILD, PAS1, and PAS2) that extend from the non-transmissive area NTA1 to the transmissive area TA.

The first undercut structure UC1 can be provided so that the organic insulating pattern OP has the second width W2 greater than the first width W1 of the plurality of inorganic insulating patterns IP. Since the organic insulating pattern OP has the second width W2 that is greater than the first width W1 of the inorganic insulating patterns IP, ends of the organic insulating pattern OP extend past ends of the inorganic insulating patterns IP and at least partially overlaps the first opening area OA1 and the second opening area OA2. The first undercut structure UC1 can form a first undercut UC11 in which the organic insulating pattern OP is more protruded than the plurality of inorganic insulating patterns IP in a direction of the touch sensor TS in the first opening area OA1. Therefore, the first undercut structure UC1 can expose at least a portion of a lower surface of the organic insulating pattern OP in the first opening area OA1, and can form a space from the buffer layer BF without being provided with the plurality of inorganic layers below the exposed lower surface.

Also, the first undercut structure UC1 can form a second undercut UC12 in which the organic insulating pattern OP is more protruded than the plurality of inorganic insulating patterns IP in a direction of the non-transmissive area NTA in the second opening area OA2. Therefore, the first undercut structure UC1 can expose at least a portion of the lower surface of the organic insulating pattern OP in the second opening area OA2, and may form a space from the buffer layer BF without being provided with the plurality of inorganic layers below the exposed lower surface.

The first undercut structure UC1 can be provided in the transmissive area TA. In more detail, an undercut area UCA in which the first undercut structure UC1 is provided can be provided between the touch sensor TS and the non-transmissive area NTA. In addition, the undercut area UCA can have a closed shape in a plane view of the transparent display panel 110. As an example, the undercut area UCA can be provided along an edge area of the transmissive area TA. In this case, the undercut area UCA can be provided to surround the touch sensor TS.

In the transparent display panel 110 according to one embodiment of the present disclosure, the first undercut structure UC1 can be provided using the plurality of inorganic insulating layers so that light transmittance may be prevented from being reduced due to the first undercut structure UC1.

The first electrode layer 120, an organic light emitting layer 130, a second electrode layer 140 and a bank 125 can be provided over the planarization layer PLN.

The first electrode layer 120 can be provided for each of the subpixel SP1, SP2, SP3 and SP4 over the planarization layer PLN. The first electrode layer 120 is not provided in the transmissive area TA. The first electrode layer 120 can be connected to the driving transistor DTR. In detail, the first electrode layer 120 can be connected to one of the source electrode SE1 and the drain electrode DE1 of the driving transistor DTR through a contact hole (not shown) passing through the planarization layer PLN and the first and second passivation layers PAS1 and PAS2.

The first electrode layer 120 can include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy can be an alloy of silver (Ag), palladium (Pd), copper (Cu), etc. The MoTi alloy can be an alloy of molybdenum (Mo) and titanium (Ti). The first electrode layer 120 can be an anode electrode.

The bank 125 can be provided over the planarization layer PLN. The bank 125 can be provided to at least partially cover an edge of the first electrode layer 120 and expose a portion of the first electrode layer 120. Therefore, the bank 125 can prevent a problem in which light emitting efficiency is deteriorated due to the concentration of a current on an end of the first electrode layer 120.

Further, the bank 125 defines light emission areas EA1, EA2, EA3 and EA4 of the subpixels SP1, SP2, SP3 and SP4. In particular, the light emission areas EA1, EA2, EA3 and EA4 of each of the subpixels SP1, SP2, SP3 and SP4 represent an area in which the first electrode layer 120, the organic light emitting layer 130 and the cathode electrode CE are sequentially stacked and holes from the first electrode layer 120 and electrons from the cathode electrode CE are combined with each other in the organic light emitting layer 130 to emit light. In this instance, the area in which the bank 125 is provided can become the non-light emission area NEA because light is not emitted therefrom, and the area in which the bank 125 is not provided and the first electrode is exposed can become the light emission area EA. The bank 125 can also include an organic layer such as an acrylic resin, an epoxy resin, a phenolic resin, a polyamide resin, and a polyimide resin.

The organic light emitting layer 130 can be disposed over the first electrode layer 120. In more detail, the organic light emitting layer 130 can include a hole transporting layer, a light emitting layer and an electron transporting layer. In this instance, when a voltage is applied to the first electrode layer 120 and the cathode electrode CE, holes and electrons move to the light emitting layer through the hole transporting layer and the electron transporting layer, respectively and are combined with each other in the light emitting layer to emit light.

In one embodiment, the organic light emitting layer 130 can be a common layer commonly provided in the subpixels SP1, SP2, SP3 and SP4. In this instance, the light emitting layer can be a white light emitting layer for emitting white light. In another embodiment, the light emitting layer of the organic light emitting layer 130 can be provided for each of the subpixels SP1, SP2, SP3 and SP4. For example, a green light emitting layer for emitting green light can be provided in the first subpixel SP1, a red light emitting layer for emitting red light can be provided in the second subpixel SP2, a blue light emitting layer for emitting blue light can be provided in the third subpixel SP3, and a white light emitting layer for emitting white light can be provided in the fourth subpixel SP4. In this instance, the light emitting layer of the organic light emitting layer 130 is not provided in the transmissive area TA.

In addition, an organic light emitting layer 130 can be separated from the non-transmissive area NTA and the transmissive area TA by the first undercut structure UC1. In more detail, the organic light emitting layer 130 can be separated from an organic light emitting layer 131 provided in the non-transmissive area NTA, an organic light emitting layer 132 provided on the first undercut structure UC1 and an organic light emitting layer 133 provided in the transmissive area TA by the first undercut structure UC1. That is, the organic light emitting layer 131 provided in the non-transmissive area NTA and the organic light emitting layer 132 provided in the transmissive area TA can be spaced apart from each other by the first undercut structure UC1.

A second electrode layer 140 can be disposed over the organic light emitting layer 130 and the bank 125. When the second electrode layer 140 is deposited on an entire surface, the second electrode layer 140 can be separated (e.g., disconnected) without being continuous between the non-transmissive area NTA and the transmissive area TA by the first undercut structure UC1. In more detail, the second electrode layer 140 can be separated into a second electrode CE provided in the non-transmissive area NTA, a second electrode DTSE provided on the first undercut structure UC1 and a second electrode TSE provided in the transmissive area TA by the first undercut structure UC1 such that the second electrode CE provided in the non-transmissive area NTA, the second electrode DTSE provided on the first undercut structure UC1, and the second electrode TSE in the transmissive area TA are disconnected from each other.

In this instance, the second electrode CE (hereinafter, referred to as 'cathode electrode') provided in the non-transmissive area NTA can be a cathode electrode, and is an element constituting a light emitting element. The cathode electrode CE can be connected to a cathode contact electrode CCT to receive a power source from the common power line VSSL. In addition, the cathode electrode CE can be a common layer that is commonly provided in the subpixels SP1, SP2, SP3 and SP4 to apply the same voltage.

Also, a second electrode TSE (hereinafter, referred to as 'touch sensor electrode') provided in the transmissive area TA can be a touch sensor electrode, and can constitute the touch sensor TS. The touch sensor electrode TSE can be connected to a touch contact electrode TCT to provide a change in capacitance to the touch line TL.

In addition, a second electrode DTSE (hereinafter, referred to as 'dummy touch sensor electrode') provided on the first undercut structure UC1 can be a dummy touch sensor electrode, and can constitute a dummy touch sensor DTS. The dummy touch sensor electrode DTSE is not connected to the touch sensor TS, and does not serve as the touch sensor TS. Further, the dummy touch sensor electrode DTSE is provided between the touch sensor TS and the light emitting element so that the touch sensor electrode TSE of the touch sensor TS and the cathode electrode CE of the light emitting element can be more certainly separated from each other.

In addition, the second electrode layer 140, which includes the cathode electrode CE, the dummy touch sensor electrode DTSE and the touch sensor electrode TSE, can include a transparent conductive material (TCO) such as ITO and IZO that can transmit light, or a semi-transmissive conductive material such as magnesium (Mg), silver (Ag) or an alloy of magnesium (Mg) and silver (Ag). When the second electrode 140 includes a semi-transmissive conductive material, the light emitting efficiency can be increased by a micro cavity.

An encapsulation layer 150 can then be provided over the light emitting elements and the touch sensors TS. In particular, the encapsulation layer 150 can be provided over the cathode electrode CE and the touch sensor electrode TSE to at least partially cover the cathode electrode CE and the touch sensor electrode TSE. The encapsulation layer 150 serves to prevent oxygen or water from being permeated into the organic light emitting layer 130, the cathode electrode CE and the touch sensor electrode TSE. Accordingly, in some embodiments, the encapsulation layer can include at least one inorganic layer and at least one organic layer. The encapsulation layer 150 can be omitted.

In addition, a color filter CF is then provided over the encapsulation layer 150. In this instance, the first substrate 111 provided with the encapsulation layer 150 and the second substrate 112 provided with the color filter CF can be bonded to each other by a filler 160. In addition, the filler 160 can be an optically clear resin (OCR) layer or an optically clear adhesive (OCA) film.

Further, the color filter CF can be patterned for each subpixel SP1, SP2, SP3 and SP4. A black matrix BM can be provided between color filters CF. In particular, the black matrix BM can be disposed between the subpixels SP1, SP2, SP3 and SP4 to prevent a color mixture from occurring between adjacent subpixels SP1, SP2, SP3 and SP4. In addition, the black matrix BM can prevent light incident from the outside from being reflected by the plurality of lines, for example, the scan lines SCANL, the pixel power line VDDL, the common power line VSSL, the reference line RL, data lines DL, the sensing line SSL etc., provided between the subpixels SP1, SP2, SP3 and SP4.

In the transparent display panel 110 according to one embodiment of the present disclosure, the touch sensor electrode TSE of the touch sensor TS and the cathode electrode CE of a light emitting element can be formed on the same layer by using the first undercut structure UC1. The transparent display panel 110 according to one embodiment of the present disclosure has a simple touch process, and does not need to add a separate mask for the touch sensor electrode TSE. Therefore, the transparent display panel 110 according to one embodiment of the present disclosure can implement process optimization and reduce production energy.

Also, in the transparent display panel 110 according to one embodiment of the present disclosure, the first undercut structure UC1 may be formed using a planarization layer PLN and a plurality of inorganic insulating layers. Therefore, the first undercut structure UC1 may be formed without loss of light transmittance.

Also, in the transparent display panel 110 according to one embodiment of the present disclosure, a plurality of undercuts UC11 and UC12 can be formed using the first undercut structure UC1, so that the touch sensor electrode TSE of the touch sensor TS and the cathode electrode CE of the light emitting element may be more reliably separated from each other. Therefore, the transparent display panel 110 according to one embodiment of the present disclosure can reduce a defect rate occurring as the touch sensor electrode TSE of the touch sensor TS and the cathode electrode CE of the light emitting element are connected to each other.

Also, in the transparent display panel 110 according to one embodiment of the present disclosure, the touch lines TL can be disposed below the light emitting element, so that light emission efficiency of the pixel P can be prevented from being degraded due to the touch lines TL.

Also, in the transparent display panel 110 according to one embodiment of the present disclosure, the touch lines TL can be disposed so as not to overlap the circuit areas CA1, CA2, CA3 and CA4, so that influence due to a circuit element can be minimized and at the same time uniformity of parasitic capacitance may be improved.

Also, in the transparent display panel 110 according to one embodiment of the present disclosure, the plurality of touch lines TL can be disposed in a first non-transmissive area NTA1 and one touch bridge line TBL for connecting the plurality of touch sensors TS to the second non-transmissive area NTA2 is provided in a second non-transmissive area NTA2, so that a decrease in a size of a transmissive area TA or light transmittance due to the plurality of touch lines TL and the touch bridge line TBL may be minimized or at least reduced.

In the transparent display panel 110 according to one embodiment of the present disclosure as described above, the touch sensor electrode TSE of the touch sensor TS and the cathode electrode CE of the light emitting element can be separated from each other by the first undercut structure UC1. However, particles can be generated in the first undercut structure UC1 during the manufacturing process, and in this case, the touch sensor electrode TSE of the touch sensor TS and the cathode electrode CE of the light emitting element can be electrically connected to each other without being separated from each other.

Since all of the plurality of touch sensors TS included in one touch block TB are electrically connected to each other, even though a defect occurs in one of the plurality of touch sensors TS, all of the touch sensors TS included in the corresponding touch block TB do not operate normally. Therefore, when the touch sensor electrode TSE of the touch sensor TS and the cathode electrode CE of the light emitting element are connected to each other to generate a defective touch sensor TS, a user's touch is not sensed in the entire touch block TB in which the defective touch sensor TS is included. A plurality of defective touch sensors TS can be generated, and the plurality of defective touch sensors TS can be disposed in their respective touch blocks TB different from each other. In this case, all of the plurality of touch blocks TB on which the plurality of defective touch sensors TS are disposed cannot sense a touch, and as a result, a touch defect rate of the transparent display panel 110 can be increased.

The transparent display panel 110 according to one embodiment of the present disclosure can include an element capable of specifying an area in which a defective touch sensor TS among the plurality of touch sensors TS included in one touch block TB is included. In addition, the transparent display panel 110 according to one embodiment of the present disclosure can electrically separate the touch sensors TS in a specific area from the touch bridge line TBL through a repair process.

Hereinafter, the element capable of specifying an area in which a defective touch sensor is included will be described in more detail with reference to FIGS. 3 and 7 to 16.

Figure 7:
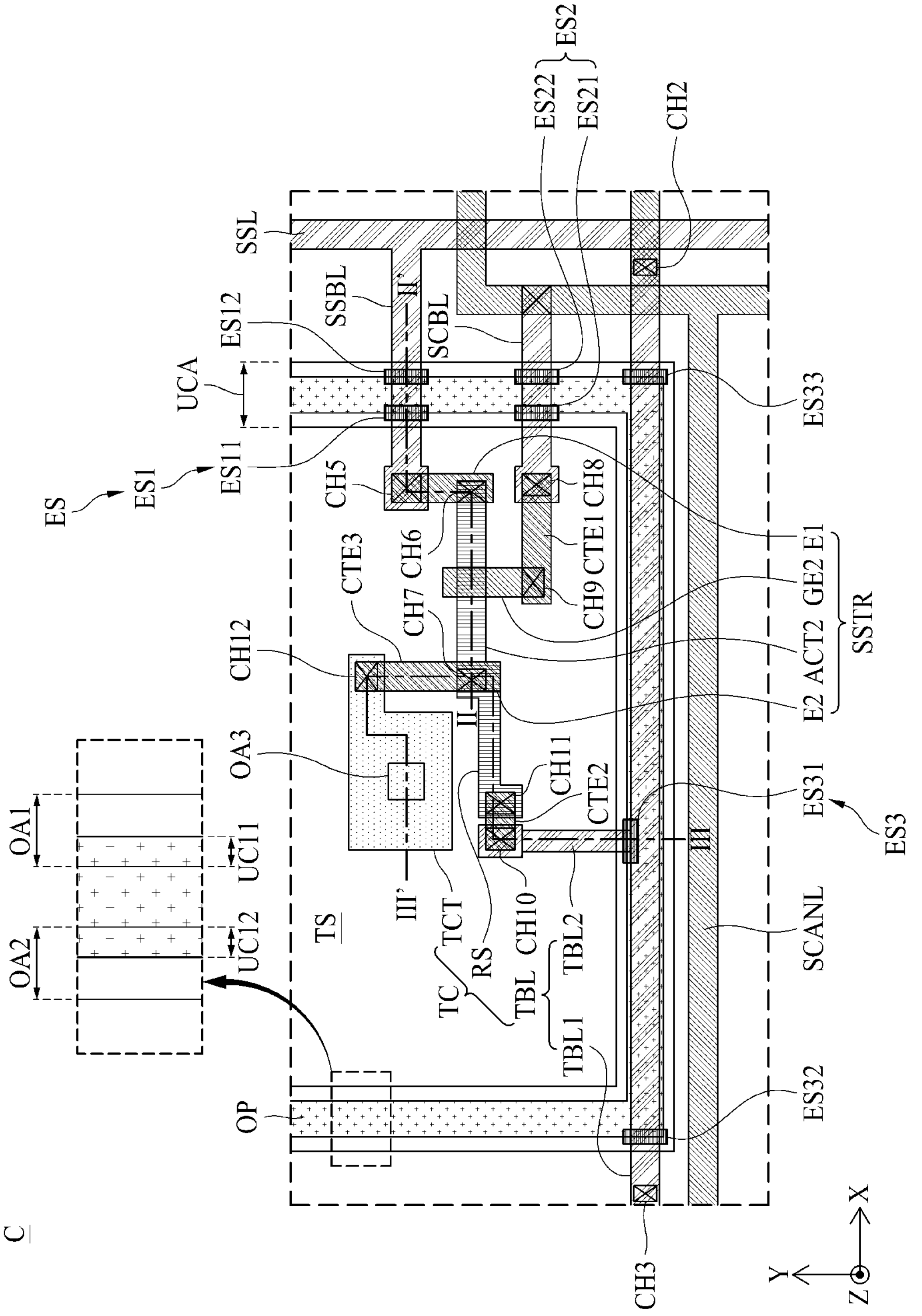
FIG. 7 is a view illustrating an example of a sensing transistor, a touch connection portion and an etch stop layer, which are provided in an area ‘C’ of FIG. 3 according to one embodiment.
Figure 8:
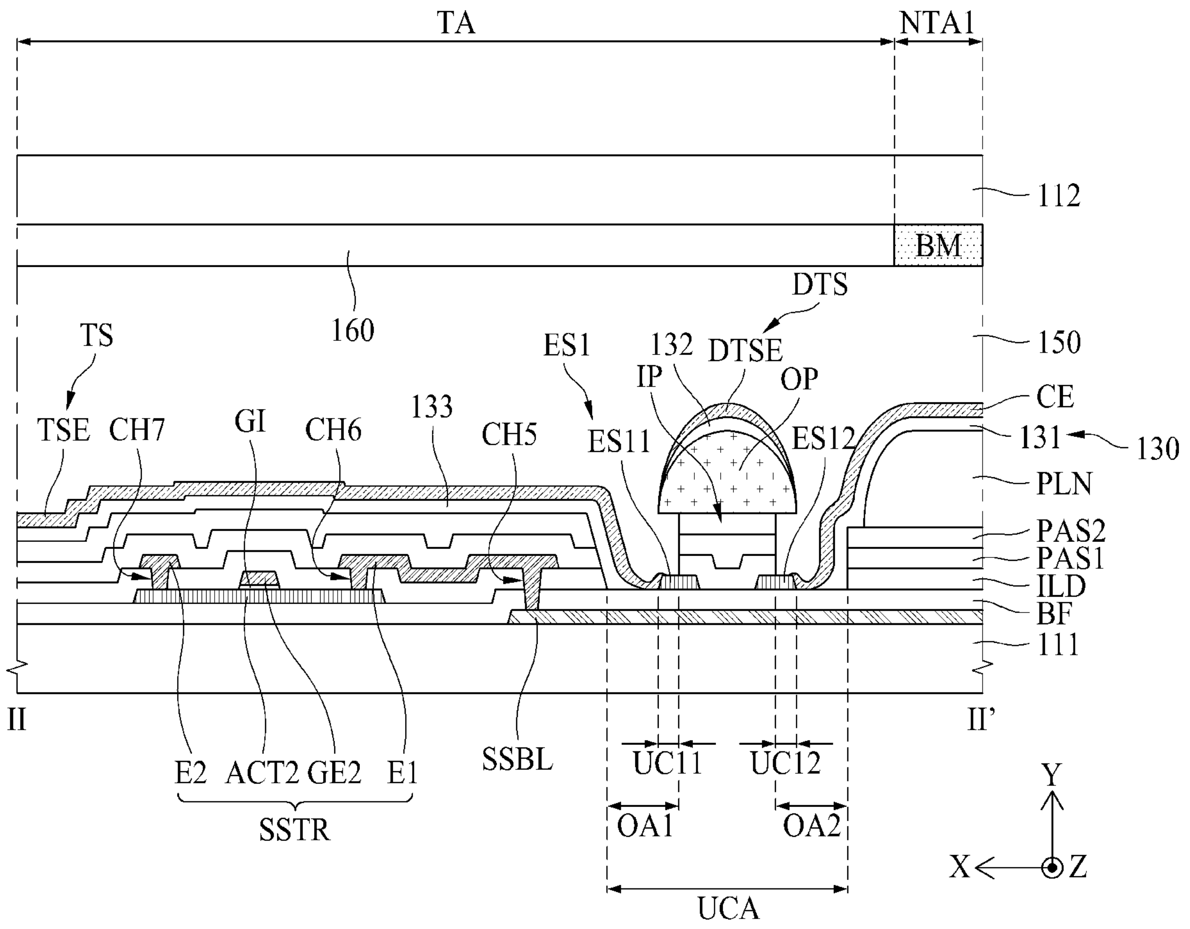
FIG. 8 is a cross-sectional view illustrating an example of line II-II' of FIG. 7 according to one embodiment.
Figure 9:
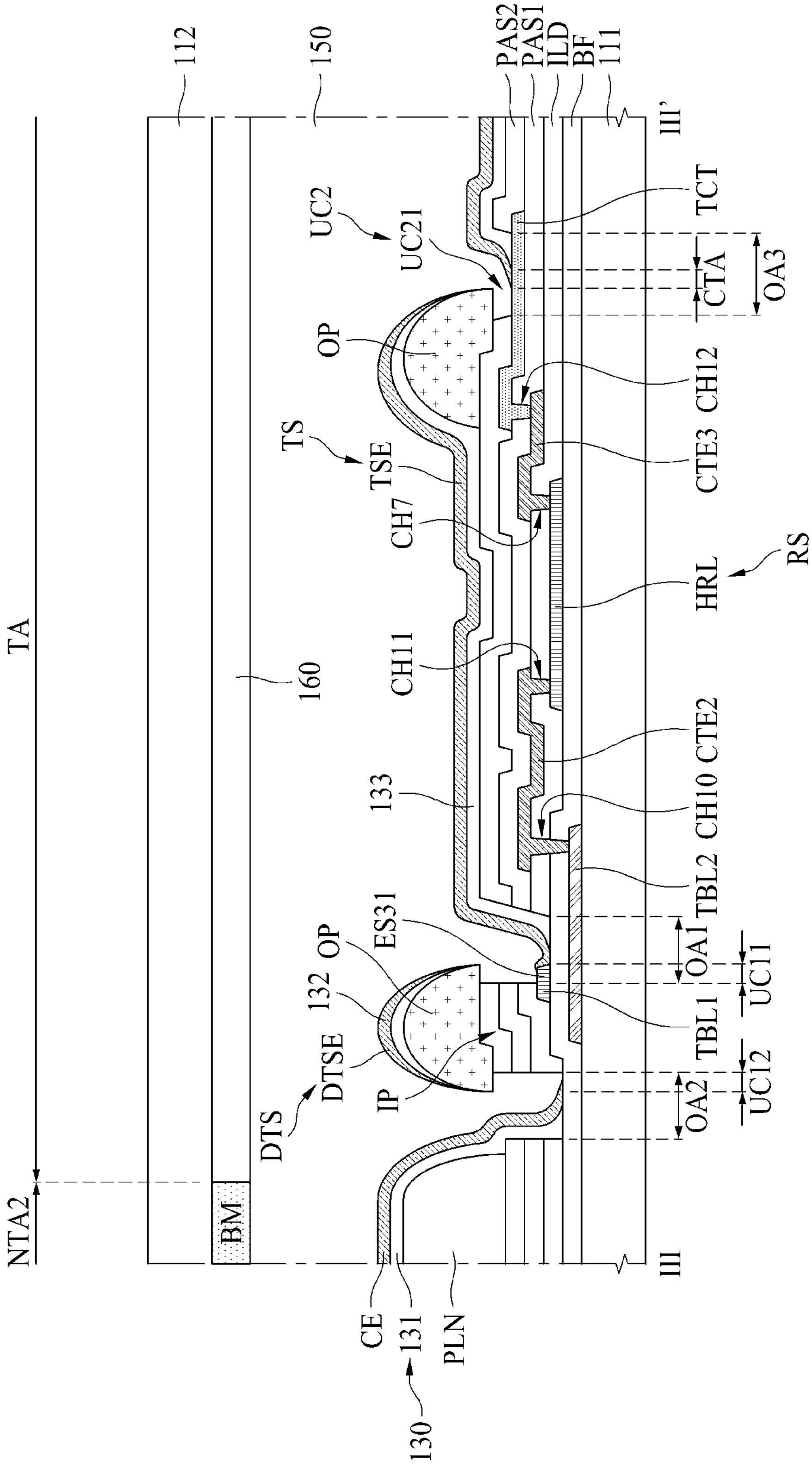
FIG. 9 is a cross-sectional view illustrating an example of line III-III' of FIG. 7 according to one embodiment.

FIG. 7 is a view illustrating an example of a sensing transistor, a touch connection portion and an etch stop layer, which are provided in an area C of FIG. 3 according to one embodiment, FIG. 8 is a cross-sectional view illustrating an example of line II-II' of FIG. 7 according to one embodiment, and FIG. 9 is a cross-sectional view illustrating an example of line III-III' of FIG. 7 according to one embodiment.

Referring to FIGS. 3 and 7 to 9, the transparent display panel 110 according to one embodiment of the present disclosure can further include a sensing transistor SSTR connecting the touch sensor TS with the sensing line SSL, and a touch connection portion TC connecting the touch sensor TS with the touch line TL, and a defective touch sensor TS can be detected using the sensing transistor SSTR and the touch connection portion TC. Also, in the transparent display panel 110 according to one embodiment of the present disclosure, when the defective touch sensor TS is detected, the touch connection portion TC connecting the defective touch sensor TS with the touch line TL can be subjected to laser cutting, so that the defective touch sensor TS and the touch line TL can be electrically separated from each other. Therefore, the remaining touch sensors TS of the corresponding touch block TB can operate normally.

The sensing transistor SSTR can be connected to the touch sensor TS and the sensing line SSL to transfer a voltage of the touch sensor TS to the sensing line SSL. In detail, as shown in FIGS. 3 and 7, the sensing transistor STR can be provided to at least partially overlap the touch sensor TS and connected to the touch sensor TS and the sensing line SSL. The sensing transistor SSTR can be disposed to be spaced apart from the first undercut structure UC1. The sensing transistor SSTR can be disposed to overlap a touch sensor electrode TCE separated by the first undercut structure UC1.

The sensing transistor SSTR can include an active layer ACT2, a gate electrode GE2, a first electrode E1 and a second electrode E2. Any one of the first electrode E1 and the second electrode E2 of the sensing transistor SSTR can be a source electrode, and the other one can be a drain electrode. The active layer ACT2, the gate electrode GE2, the first electrode E1 and the second electrode E2 of the sensing transistor SSTR are shown as being disposed to overlap the touch sensor TS, but the present disclosure is not limited thereto.

The gate electrode GE2 of the sensing transistor SSTR can be electrically connected to the scan line SCANL. In detail, the gate electrode GE2 of the sensing transistor SSTR can be connected to a scan bridge line SCBL electrically connected to the scan line SCANL. The scan line SCANL and the scan bridge line SCBL can be provided on their respective layers different from each other. The scan bridge line SCBL can be electrically connected to the scan line SCANL at one end through a contact hole, and can be extended to an area overlapped with the touch sensor TS across the first undercut structure UC1. The scan bridge line SCBL can be electrically connected to the gate electrode GE2 of the sensing transistor SSTR at the other end.

The scan bridge line SCBL can be connected to the gate electrode GE2 of the sensing transistor SSTR through a first connection electrode CTE1 as shown in FIG. 7. The first connection electrode CTE1 can be provided between the interlayer insulating layer ILD and the first passivation layer PAS1. The first connection electrode CTE1 can be electrically connected to the scan bridge line SCBL at one end through an eighth contact hole CH8, and can be electrically connected to the gate electrode GE2 of the sensing transistor SSTR at the other end through a ninth contact hole CH9. In one embodiment, the first connection electrode CTE1 can be disposed on the same layer as the source electrode SE1 and the drain electrode DE1 of the driving transistor DTR, but the present disclosure is not necessarily limited thereto. In another embodiment, the scan bridge line SCBL can be directly connected to the gate electrode GE2 of the sensing transistor SSTR.

The scan bridge line SCBL can be provided on a layer provided between a first substrate 111 and the driving transistor DTR. In one embodiment, the scan bridge line SCBL can be formed of the same material as that of a light-shielding layer LS on the same layer as the light-shielding layer LS. Since the scan bridge line SCBL is extended to the sensing transistor SSTR disposed to overlap the touch sensor TS in the scan line SCANL disposed in the non-transmissive area NTA, the scan bridge line SCBL has no option but to cross the first undercut structure UC1. The first undercut structure UC1 can be formed through a wet etching process. In the transparent display panel 110 according to one embodiment of the present disclosure, the scan bridge line SCBL can be formed on the same layer as the light-shielding layer LS so that the scan bridge line SCBL is prevented from being lost during the wet etching process for forming the first undercut structure UC1.

The active layer ACT2 of the sensing transistor SSTR can be provided to at least partially overlap the gate electrode GE2 below the gate electrode GE2. The active layer ACT2 can be connected to the first electrode E1 at one end through a sixth contact hole CH6, and can be connected to the second electrode E2 at the other end through a seventh contact hole CH7.

The first electrode E1 of the sensing transistor SSTR can be electrically connected to the sensing line SSL. In detail, the first electrode E1 of the sensing transistor SSTR can be connected to the sensing bridge line SSBL electrically connected to the sensing line SSL. For example, the sensing bridge line SSBL can be electrically connected to the sensing line SSL at one end, and can be extended to an area overlapped with the touch sensor TS across the first undercut structure UC1. The sensing bridge line SSBL can be formed on the same layer as the sensing line SSL and thus branched from the sensing line SSL. The sensing bridge line SSBL can be electrically connected to the first electrode E1 of the sensing transistor SSTR at the other end.

The sensing bridge line SSBL can be provided on a layer provided between the first substrate 111 and the driving transistor DTR. In one embodiment, the sensing bridge line SSBL can be formed of the same material as that of the light-shielding layer LS on the same layer as the light-shielding layer LS. Since the sensing bridge line SSBL is extended from the sensing line SSL disposed in the non-transmissive area NTA to the sensing transistor SSTR disposed to overlap the touch sensor TS, the sensing bridge line SSBL has no option but to cross the first undercut structure UC1. The first undercut structure UC1 can be formed through a wet etching process. In the transparent display panel 110 according to one embodiment of the present disclosure, the sensing bridge line SSBL can be formed on the same layer as the light-shielding layer LS so that the sensing bridge line SSBL is prevented from being lost during the wet etching process for forming the first undercut structure UC1.

The first electrode E1 of the sensing transistor SSTR can be connected to the sensing bridge line SSBL at one end through a fifth contact hole CH5, and can be connected to the active layer ACT2 at the other end through a sixth contact hole CH6. The second electrode E2 of the sensing transistor SSTR can be connected to the active layer ACT2 at one end through the seventh contact hole CH7, and can be connected to the touch contact electrode TCT at the other end through a twelfth contact hole CH12. Since the touch contact electrode TCT is electrically connected to the touch sensor TS, the second electrode E2 of the sensing transistor SSTR can be electrically connected to the touch sensor TS through the touch contact electrode TCT.

As described above, the gate electrode GE2 of the sensing transistor SSTR can be connected to the scan line SCANL, and the first electrode E1 of the sensing transistor SSTR can be connected to the sensing line SSL. The second electrode E2 of the sensing transistor SSTR can be connected to the touch sensor electrode TSE of the touch sensor TS. The sensing transistor SSTR can be turned on in response to a scan signal applied through the scan line SCANL. When the sensing transistor SSTR is turned on, a voltage of the touch sensor electrode TSE can be transferred to the sensing line SSL.

The touch connection portion TC connects the touch sensor TS with the touch line TL. The touch connection portion TC can include a touch bridge line TBL, a resistance sensor RS that includes a high resistance area, and a touch contact electrode TCT.

The touch bridge line TBL can connect any one of the plurality of touch lines TL with the touch sensor TS. To this end, the touch bridge line TBL can include a first touch bridge line TBL1 and a second touch bridge line TBL2.

The first touch bridge line TBL1 can be connected to any one of the plurality of touch lines TL through a first contact hole CH1. The first touch bridge line TBL1 can be extended in a second direction (e.g., X-axis direction).

The second touch bridge line TBL2 can be protruded from the first touch bridge line TBL1 and extended toward the touch sensor TS. The second touch bridge line TBL2 can be extended to an area, which is overlapped with the touch sensor TS, across the first undercut structure UC1.

The second touch bridge line TBL2 can connect the first touch bridge line TBL1 with the resistance sensor RS. In detail, one end of the second touch bridge line TBL2 can be connected to the first touch bridge line TBL1, and the other end thereof can be connected to the second connection electrode CTE2 through a tenth contact hole CH10. The second touch bridge line TBL2 can be connected to the resistance sensor RS through the second connection electrode CTE2, but is not necessarily limited thereto. The second touch connection line TBL2 can be directly connected to the resistance sensor RS.

The second touch bridge line TBL2 can be provided on a layer provided between the first substrate 111 and the driving transistor DTR. In one embodiment, the second touch bridge line TBL2 can be formed of the same material as that of the light-shielding layer on the same layer as the light-shielding layer LS. Since the second touch bridge line TBL2 is extended from the first touch bridge line TBL1 disposed in the second non-transmissive area NTA to the resistance sensor RS disposed to overlap the touch sensor TS, the second touch bridge line TBL2 can have no option but to cross the first undercut structure UC1. The first undercut structure UC1 can be formed through a wet etching process. In the transparent display panel 110 according to one embodiment of the present disclosure, the second touch bridge line TBL2 can be formed on the same layer as the light-shielding layer LS so that the second touch bridge line TBL2 is prevented from being lost during the wet etching process for forming the first undercut structure UC1.

The second connection electrode CTE2 can electrically connect the second touch bridge line TBL2 with the resistance sensor RS. One end of the second connection electrode CTE2 can be connected to the second touch bridge line TBL2 through the tenth contact hole CH10, and the other end thereof can be connected to the resistance sensor RS through an eleventh contact hole CH11. In one embodiment, the second connection electrode CTE2 can be disposed on the same layer as the source electrode SE1 and the drain electrode DE1 of the driving transistor DTR.

The resistance sensor RS can be disposed between the second touch bridge line TBL2 and the touch contact electrode TCT, and can include a high resistance line HRL. One end of the high resistance line HRL can be connected to the second connection electrode CTE2 through the eleventh contact hole CH11, and the other end of the high resistance line HRL can be connected to the third connection electrode CTE3 through a seventh contact hole CH7. Although FIG. 9 illustrates that the high resistance line HRL is connected to the second touch bridge line TBL2 through the second connection electrode CTE2, the present disclosure is not limited thereto. In another embodiment, the high resistance line HRL can be directly connected with the second touch bridge line TBL2.

The high resistance line HRL can be made of a silicon-based semiconductor material or an oxide-based semiconductor material to implement high resistance. For example, the high resistance line HRL can be made of the same material on the same layer as the active layer ACT1 of the driving transistor DTR.

The third connection electrode CTE3 can electrically connect the resistance sensor RS with the touch contact electrode TCT. One end of the third connection electrode CTE3 can be connected to the high resistance line HRL through the eleventh contact hole CH11, and the other end of the third connection electrode CTE3 can be connected to the touch contact electrode TCT through the twelfth contact hole CH12. The third connection electrode CTE3 can be the same element as the second electrode E2 of the sensing transistor STR, but is not limited thereto. In another embodiment, the third connection electrode CTE3 can be spaced apart from the second electrode E2 of the sensing transistor SSTR as a separate element. In one embodiment, the third connection electrode CTE3 can be disposed on the same layer as the source electrode SE1 and the drain electrode DE1 of the driving transistor DTR.

The touch contact electrode TCT can be provided in the transmissive area TA. The touch contact electrode TCT can be disposed between the high resistance line HRL and the touch sensor electrode TSE to electrically connect the high resistance line HRL with the touch sensor electrode TSE. The touch contact electrode TCT can be connected to the high resistance line HRL through the third connection electrode CTE3.

At least a portion of an upper surface of the touch contact electrode TCT can be exposed by the second undercut structure UC2, and the touch sensor electrode TSE can be connected to the exposed upper surface. In detail, the touch contact electrode TCT can be provided on a layer provided between the buffer film BF and the second passivation layer PAS2.

In one embodiment, the touch contact electrode TCT can be provided between the first passivation layer PAS1 and the second passivation layer PAS2. In this case, the second passivation layer PAS2 can be provided with a third opening area OA3 that exposes at least a portion of the upper surface of the touch contact electrode TCT. The second undercut structure UC2 can form an undercut UC21 more protruded than the second passivation layer PAS2 in the third opening area OA3 of the second passivation layer PAS2. Therefore, the undercut UC21 can expose at least a portion of the lower surface of the planarization layer PLN, and can expose at least a portion of the upper surface of the touch contact electrode TCT without being provided with the second passivation layer PAS2 below the exposed lower surface. The second undercut structure UC2 can be disposed in an area in which the touch sensor TS is provided.

The touch sensor electrode TSE can be deposited on the exposed upper surface of the touch contact electrode TCT to form a contact area CTA and electrically connected to the touch contact electrode TCT. The touch contact electrode TCT can transfer a change in the capacitance of the touch sensor electrode TSE to the touch line TL through the high resistance line HRL and the touch bridge line TBL. In addition, the touch contact electrode TCT can transfer a voltage of the touch sensor electrode TSE to the sensing line SSL through the sensing transistor SSTR.

In the transparent display panel 110 according to one embodiment of the present disclosure, a defective touch sensor TS can be detected using the sensing transistor SSTR and the resistance sensor RS. In detail, as described above, particles can be generated in the first undercut structure UC1, and in this case, the touch sensor electrode TSE of the touch sensor TS and the cathode electrode CE of the light emitting element can be electrically connected to each other without being separated from each other. When a different voltage is applied to each of the touch line TL and the common power line VSSL, current flows from the touch sensor electrode TSE to the cathode electrode CE in the defective touch sensor TS.

For example, a first voltage, e.g., 20V can be applied to the touch line TL, and a second voltage, e.g., 0V can be applied to the common power line VSSL. Since the touch sensor electrode TSE and the cathode electrode CE of the light emitting element are electrically connected to each other, a current path can be generated from the touch sensor electrode TSE of the defective touch sensor TS to the cathode electrode CE. At this time, when the resistance sensor RS is provided on the current path, a voltage of the defective touch sensor TS is reduced by high resistance of the resistance sensor RS. On the other hand, since the current does not flow to the touch sensor electrode TSE of the normal touch sensor TS, the voltage applied from the touch line TL can be maintained in the normal touch sensor TS.

The sensing transistor SSTR connected to the touch sensor TS can be turned on in accordance with the scan signal applied through the scan line SCANL. When the sensing transistor SSTR is turned on, a voltage of the touch sensor electrode TSE can be applied to the sensing line SSL. At this time, when the touch sensor TS is the normal touch sensor, the voltage of the touch sensor TS can be the same as or similar to the first voltage applied to the touch line TL, for example, 20V. On the other hand, when the touch sensor TS is the defective touch sensor TS, since the voltage of the defective touch sensor TS is reduced by high resistance of the resistance sensor RS, the voltage of the touch sensor TS can have a value which is more significantly reduced compared to the first voltage applied to the touch line TL, for example, less than 20V.

As described above, in the transparent display panel 110 according to one embodiment of the present disclosure, the defective touch sensor can be detected using the sensing transistor SSTR and the high resistance area. When the defective touch sensor TS is detected, the touch sensor TS can be electrically separated from the touch line TL in the transparent display panel 110 by laser cutting of the touch connection portion TC connected to the detected touch sensor TS, particularly, the second touch bridge line TBL2.

Therefore, the remaining touch sensors TS of the corresponding touch block TB can operate normally.

In the transparent display panel 110 according to one embodiment of the present disclosure, the defective touch sensor TS can be exactly detected within one touch block TB. Therefore, the transparent display panel 110 according to one embodiment of the present disclosure can reduce a touch defect rate and improve a touch recognition rate.

Meanwhile, in the transparent display panel 110 according to one embodiment of the present disclosure, an etch stop layer ES can be disposed between the first undercut structure UC1 and a signal line crossing the first undercut structure UC1.

The signal line can include a touch bridge TBL connecting the touch sensor TS with the touch line TL. In addition, the signal line can further include at least one of a sensing bridge line SSBL connecting the sensing transistor SSTR with the sensing line SSL and a scan bridge line SCBL connecting the sensing transistor SSTR with the scan line SCANL when the sensing transistor SSTR is provided to overlap the touch sensor TS.

The signal line, such as the touch bridge line TBL, the sensing bridge line SSBL and the scan bridge line SCBL, can be extended from the non-transmissive area NTA to an area, which overlaps the touch sensor TS, across the first undercut structure UC1. At this time, in order to prevent the signal line from being damaged when the first undercut structure UC1 is formed, the signal line can be formed on the same layer as a layer provided below the first undercut structure UC1, for example, the light-shieling layer LS.

When the first undercut structure UC1 is formed, an etching solution for etching a portion of the inorganic insulating layers such as the interlayer insulating layer ILD and the first and second passivation layers PAS1 and PAS2 can etch up to the buffer film BF through over etching. Hereinafter, the over etching in the process of forming the first undercut structure UC1 will be described with reference to FIGS. 10A to 10C.

Figure 10A:
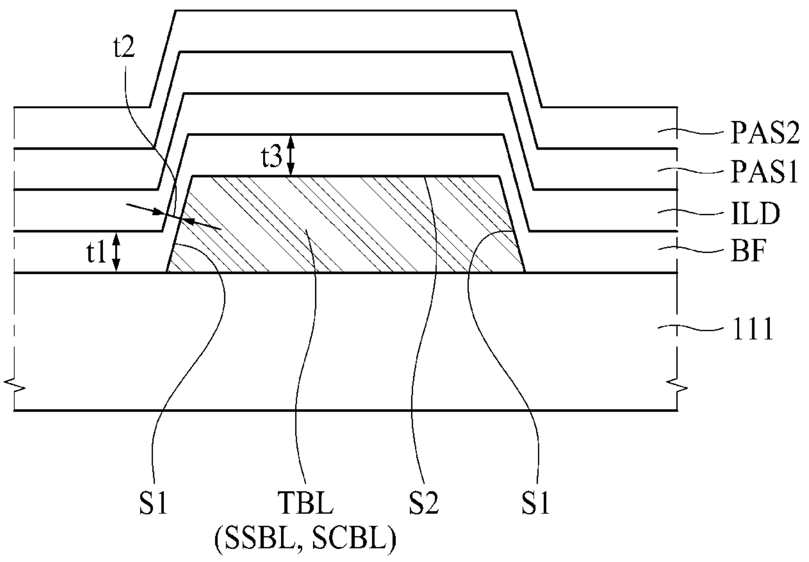
FIG. 10A is a view illustrating an example of a stacked structure of an undercut formation area prior to a wet etching process according to one embodiment.
Figure 10B:
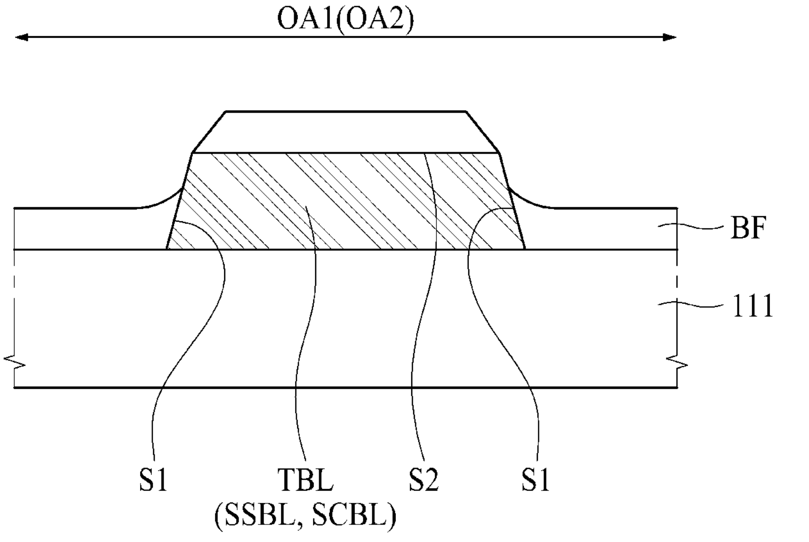
FIG. 10B is a view illustrating an example of over-etching in a wet etching process for the stacked structure shown in FIG. 10A according to one embodiment.
Figure 10C:
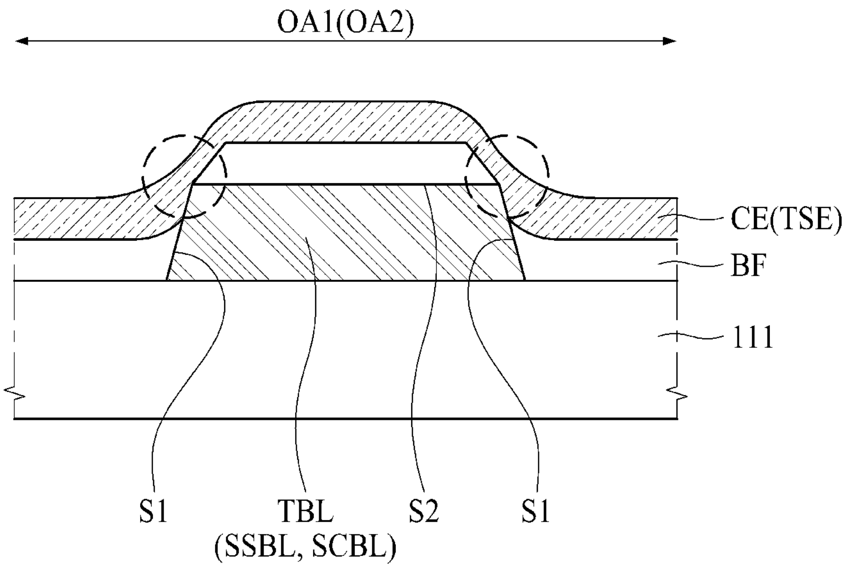
FIG. 10C is a view illustrating an example that a cathode electrode or a touch sensor electrode is formed on the stacked structure shown in FIG. 10B according to one embodiment.
Figure 11:
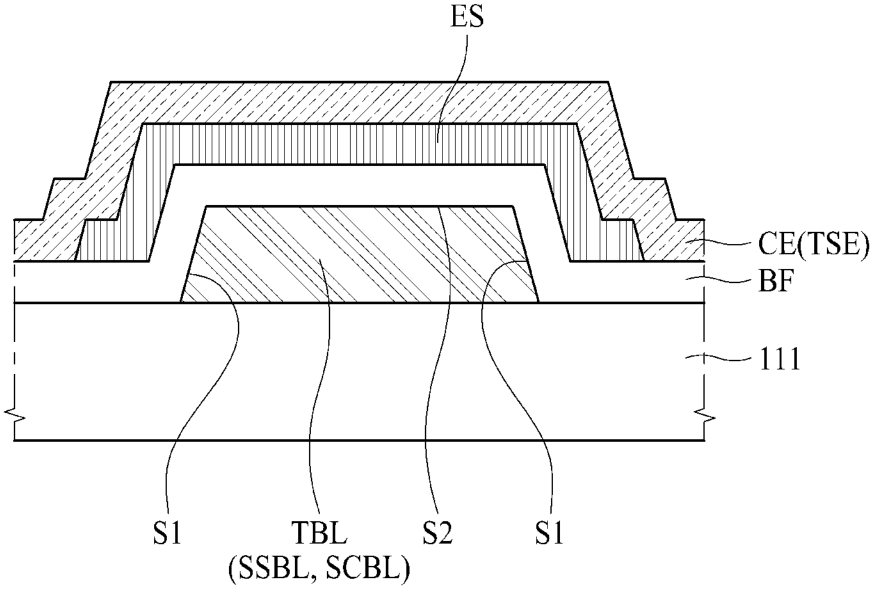
FIG. 11 is a view illustrating an example of an etch stop layer provided between a signal line and a first undercut structure according to one embodiment.

FIG. 10A is a view illustrating an example of a stacked structure of an undercut formation area prior to a wet etching process according to one embodiment, FIG. 10B is a view illustrating an example of over-etching in a wet etching process for the stacked structure shown in FIG. 10A according to one embodiment, and FIG. 10C is a view illustrating an example that a cathode electrode or a touch sensor electrode is formed on the stacked structure shown in FIG. 10B according to one embodiment. FIG. 11 is a view illustrating an example of an etch stop layer provided between a signal line and a first undercut structure according to one embodiment.

Referring to FIG. 10A, before the wet etching process, a plurality of inorganic insulating layers, for example, a buffer film BF, an interlayer insulating layer ILD, a first passivation layer PAS1 and a second passivation layer PAS2 can be stacked on a signal line such as a touch bridge line TBL, a sensing bridge line SSBL or a scan bridge line SCBL.

In the transparent display panel 110 according to one embodiment of the present disclosure, a first opening area OA1 and a second opening area OA2 can be formed, so that a first undercut structure UC1 can be formed. In the transparent display panel 110 according to one embodiment of the present disclosure, the first opening area OA1 and the second opening area OA2 can be formed in the plurality of inorganic insulating layers through a wet etching process using an etchant.

In this case, the first undercut structure UC1 has a large step difference to reliably separate the cathode electrode CE and the touch sensor electrode TSE, which are formed on the same layer, from each other. The first undercut structure UC1 can form the first opening area OA1 and the second opening area OA2 in the plurality of inorganic insulating layers, that is, the interlayer insulating layer ILD, the first passivation layer PAS1 and the second passivation layer PAS2 except for the buffer film BF directly covering the touch bridge line TBL, the sensing bridge line SSBL or the scan bridge line SCBL, thereby forming a large step difference from the organic pattern as large as possible.

In the transparent display panel 110 according to one embodiment of the present disclosure, since a total thickness of the interlayer insulating layer ILD, the first passivation layer PAS1 and the second passivation layer PAS2 is large, the first opening area OA1 and the second opening area OA2 can be formed in the interlayer insulating layer ILD, the first passivation layer PAS1 and the second passivation layer PAS2 by using a high-concentration etchant. Wet etching using the high-concentration etchant can cause over-etching, whereby the buffer film BF can be etched.

In addition, the buffer film BF has a relatively thin thickness as compared with other inorganic insulating layers, and can be thinner at a side S1 having a taper of the touch bridge line TBL, the sensing bridge line SSBL or the scan bridge line SCBL. That is, a thickness t2 of the buffer film BF provided on the side S1 of the touch bridge line TBL, the sensing bridge line SSBL or the scan bridge line SCBL can be thinner than a thickness t1 of the buffer film BF provided on the upper surface of the first substrate 111 and a thickness t3 of the buffer film BF provided on an upper surface S2 of the touch bridge line TBL, the sensing bridge line SSBL or the scan bridge line SCBL. Therefore, when the buffer film BF is over-etched by the high-concentration etchant, as shown in FIG. 10B, the touch bridge line TBL, the sensing bridge line SSBL or the scan bridge line SCBL is likely to be exposed at the side S1.

The touch bridge line TBL, the sensing bridge line SSBL or the scan bridge line SCBL can be damaged by the etchant that is permeated into the exposed side S1. Further, when the organic light emitting layer 130 and the second electrode layer 140 are sequentially stacked, the touch bridge line TBL, the sensing bridge line SSBL or the scan bridge line SCBL can be in contact with the second electrode layer 140 at the exposed side S1 as shown in FIG. 10C. Therefore, the touch bridge line TBL, the sensing bridge line SSBL or the scan bridge line SCBL can generate a short circuit with the second electrode layer 140.

The second electrode layer 140 can be the cathode electrode CE of the light emitting element or the touch sensor electrode TSE of the touch sensor TS in accordance with the position of the undercut. When the sensing bridge line SSBL or the scan bridge line SCBL generates a short circuit with the cathode electrode CE, the sensing transistor SSTR cannot normally operate and cannot detect a defective touch sensor, whereby a touch defect rate can be increased.

In the transparent display panel 110 according to one embodiment of the present disclosure, as shown in FIG. 11, the etch stop layer ES can be disposed between the touch bridge line TBL, the sensing bridge line SSBL or the scan bridge line SCBL and the first undercut structure UC1 to prevent a short circuit between the touch bridge line TBL, the sensing bridge line SSBL or the scan bridge line SCBL and the second electrode layer 140.

The etch stop layer ES is provided on an upper surface of the buffer film BF in the area in which the touch bridge line TBL, the sensing bridge line SSBL or the scan bridge line SCBL is formed, so that the buffer film BF can prevented from being etched due to over-etching of the etchant when the first undercut structure UC1 is formed.

As shown in FIG. 7, the etch stop layer ES can include a first etch stop layer ES1, a second etch stop layer ES2 and a third etch stop layer ES3.

The first etch stop layer ES1 can be provided to at least partially overlap the sensing bridge line SSBL in an area UCA in which the first undercut structure UC1 is formed. In detail, the first etch stop layer ES1 can be provided between the first undercut structure UC1 and the sensing bridge line SSBL in the area UCA in which the first undercut structure UC1 is formed. When the first undercut structure UC1 is formed, the etchant has a high possibility of over-etching in an area where the undercuts UC11 and UC12 are formed. Therefore, the first etch stop layer ES1 can be patterned in an area overlapped with the undercuts UC11 and UC12.

The first etch stop layer ES1 can include a (1-1)th etch stop layer ES11 and a (1-2)th etch stop layer ES12 as much as the number of undercuts UC11 and UC12. The (1-1)th etch stop layer ES11 can be patterned so that the organic insulating pattern OP overlaps the first undercut UC11 more protruded in a direction of the touch sensor TS than a plurality of inorganic insulating patterns IP. The (1-1)th etch stop layer ES11 can be provided below a lower surface of the organic insulating pattern OP protruded from the first opening area OA1. The (1-1)th etch stop layer ES11 can be provided on the upper surface of the buffer film BF overlapped with the sensing bridge line SSBL. The (1-1)th etch stop layer ES11 can be provided on the side of the sensing bridge line SSBL to prevent the buffer film BF covering the side of the sensing bridge line SSBL from being etched. The (1-1)th etch stop layer ES11 can be also provided on the upper surface of the sensing bridge line SSBL to prevent the buffer film BF covering the upper surface of the sensing bridge line SSBL from being etched. In FIGS. 7 and 8, the (1-1)th etch stop layer ES11 is provided on the side and the upper surface of the sensing bridge line SSBL, but is not limited thereto. In another embodiment, the (1-1)th etch stop layer ES11 can be provided only on the side of the sensing bridge line SSBL.

The (1-2)th etch stop layer ES12 can be patterned so that the organic insulating pattern OP overlaps the second undercut UC12 more protruded in a direction of the non-transmissive area NTA than the plurality of inorganic insulating patterns IP. The (1-2)th etch stop layer ES12 can be provided below the lower surface of the organic insulating pattern OP protruded from the second opening area OA2. The (1-2)th etch stop layer ES12 can be provided on the upper surface of the buffer film BF overlapped with the sensing bridge line SSBL. The (1-2)th etch stop layer ES12 can be provided on the side of the sensing bridge line SSBL to prevent the buffer film BF covering the side of the sensing bridge line SSBL from being etched. The (1-2)th etch stop layer ES12 can be also provided on the upper surface of the sensing bridge line SSBL to prevent the buffer film BF covering the upper surface of the sensing bridge line SSBL from being etched. In FIGS. 7 and 8, the (1-2)th etch stop layer ES12 is provided on the side and the upper surface of the sensing bridge line SSBL, but is not limited thereto. In another embodiment, the (1-2)th etch stop layer ES12 can be provided only on the side of the sensing bridge line SSBL.

The second etch stop layer ES2 can be provided to at least partially overlap the scan bridge line SCBL in the area UCA in which the first undercut structure UC1 is formed. In detail, the second etch stop layer ES2 can be provided between the first undercut structure UC1 and the scan bridge line SCBL in the area UCA in which the first undercut structure UC1 is formed. When the first undercut structure UC1 is formed, the etchant has a high possibility of over-etching in the area where the undercuts UC11 and UC12 are formed. Therefore, the second etch stop layer ES2 can be patterned only in the area overlapped with the undercuts UC11 and UC12.

The second etch stop layer ES2 can include a (2-1)th etch stop layer ES21 and a (2-2)th etch stop layer ES22 as much as the number of undercuts UC11 and UC12. The (2-1)th etch stop layer ES21 can be patterned so that the organic insulating pattern OP overlaps the first undercut UC11 more protruded in a direction of the touch sensor TS than the plurality of inorganic insulating patterns IP. The (2-1)th etch stop layer ES21 can be provided below the lower surface of the organic insulating pattern OP protruded from the first opening area OA1. The (2-1)th etch stop layer ES21 can be provided on the upper surface of the buffer film BF overlapped with the scan bridge line SCBL. In this case, the (2-1)th etch stop layer ES21 can be provided on the side of the scan bridge line SCBL to prevent the buffer film BF covering the side of the scan bridge line SCBL from being etched. The (2-1)th etch stop layer ES21 can be also provided on the upper surface of the scan bridge line SCBL to prevent the buffer film BF covering the upper surface of the scan bridge line SCBL from being etched. The (2-1)th etch stop layer ES21 can be provided on the side and the upper surface of the scan bridge line SCBL, but the present disclosure is not limited thereto. In another embodiment, the (2-1)th etch stop layer ES21 can be provided only on the side of the scan bridge line SCBL.

The (2-2)th etch stop layer ES22 can be patterned so that the organic insulating pattern OP overlaps the second undercut UC12 more protruded in the direction of the non-transmissive area NTA than the plurality of inorganic insulating patterns IP. The (2-2)th etch stop layer ES22 can be provided below the lower surface of the organic insulating pattern OP protruded from the second opening area OA2. The (2-2)th etch stop layer ES22 can be provided on the upper surface of the buffer film BF overlapped with the scan bridge line SCBL. In this case, the (2-2)th etch stop layer ES22 can be provided on the side of the scan bridge line SCBL to prevent the buffer film BF covering the side of the scan bridge line SCBL from being etched. The (2-2)th etch stop layer ES22 can be also provided on the upper surface of the scan bridge line SCBL to prevent the buffer film BF covering the upper surface of the scan bridge line SCBL from being etched. The (2-2)th etch stop layer ES22 is provided on the side and the upper surface of the scan bridge line SCBL, but is not limited thereto. In another embodiment, the (2-2)th etch stop layer ES22 can be provided only on the side of the scan bridge line SCBL.

The third etch stop layer ES3 can be provided to at least partially overlap the touch bridge line TBL in the area UCA in which the first undercut structure UC1 is formed. In detail, the third etch stop layer ES3 can be provided between the first undercut structure UC1 and the touch bridge line TCBL in the area UCA in which the first undercut structure UC1 is formed. When the first undercut structure UC1 is formed, the etchant has a high possibility of over-etching in the areas where the undercuts UC11 and UC12 are formed. Thus, the third etch stop layer ES2 can be patterned only in an area overlapped with the undercuts UC11 and UC12.

As shown in FIG. 7, the touch bridge line TBL can be disposed so that the first touch bridge line TBL extended in the second direction (e.g., X-axis direction) overlaps the area UCA in which the first undercut structure UC1 is formed. In this case, the third etch stop layer ES3 can include a (3-1)th etch stop layer ES31, a (3-2)th etch stop layer ES32 and a (3-3)th etch stop layer ES33.

The (3-1)th etch stop layer ES31 can be patterned so that the organic insulating pattern OP overlaps the first undercut UC11 more protruded in the direction of the touch sensor TS than the plurality of inorganic insulating patterns IP. The (3-1)th etch stop layer ES31 can be provided below the lower surface of the organic insulating pattern OP protruded from the first opening area OA1. The (3-1)th etch stop layer ES31 can be provided on the upper surface of the buffer film BF overlapped with the touch bridge line TBL, especially the second touch bridge line TBL2. In this case, the (3-1)th etch stop layer ES31 can be provided on the side of the second touch bridge line TBL2 to prevent the buffer film BF covering the side of the second touch bridge line TBL2 from being etched. The (3-1)th etch stop layer ES31 can be also provided on the upper surface of the second touch bridge line TBL2 to prevent the buffer film BF covering the upper surface of the second touch bridge line TBL2 from being etched. In FIGS. 7 and 9, the (3-1)th etch stop layer ES31 is provided on the side and the upper surface of the second touch bridge line TBL2, but is not limited thereto. In another embodiment, the (3-1)th etch stop layer ES31 can be provided only on the side of the second touch bridge line TBL2.

The (3-2)th etch stop layer ES32 and the (3-3)th etch stop layer ES33 can be patterned so that the organic insulating pattern OP overlaps the second undercut UC12 more protruded in the direction of the non-transmissive area NTA than the plurality of inorganic insulating patterns IP. The (3-2)th etch stop layer ES32 and the (3-3)th etch stop layer ES33 can be provided below the lower surface of the organic insulating pattern OP protruded from the second opening area OA2. The (3-2)th etch stop layer ES32 and the (3-3)th etch stop layer ES33 can be provided on the upper surface of the buffer film BF overlapped with the touch bridge line TBL, especially the first touch bridge line TBL1. In this case, the (3-2)th etch stop layer ES32 can be provided to overlap one side of the first touch bridge line TBL1 disposed in the undercut area UCA, and the (3-3)th etch stop layer ES33 can be provided to overlap the other side of the first touch bridge line TBL1 disposed in the undercut area UCA.

The (3-2)th etch stop layer ES32 and the (3-3)th etch stop layer ES33 can be provided on the side of the first touch bridge line TBL1 to prevent the buffer film BF covering the side of the first touch bridge line TBL1 from being etched. The (3-2)th etch stop layer ES32 and the (3-3)th etch stop layer ES33 can be also provided on the upper surface of the first touch bridge line TBL1 to prevent the buffer film BF covering the upper surface of the first touch bridge line TBL1 from being etched. In FIGS. 7 and 9, the (3-2)th etch stop layer ES32 and the (3-3)th etch stop layer ES33 are provided on the side and the upper surface of the first touch bridge line TBL1, but are not limited thereto. In another embodiment, the (3-2)th etch stop layer ES32 and the (3-3)th etch stop layer ES33 can be provided only on the side of the first touch bridge line TBL1.

In one embodiment, the first etch stop layer ES1, the second etch stop layer ES2 and the third etch stop layer ES3 can include a silicon-based semiconductor material or an oxide-based semiconductor material. For example, the first etch stop layer ES1, the second etch stop layer ES2 and the third etch stop layer ES3 can include indium gallium zinc oxide (IGZO). In the transparent display panel 110 according to one embodiment of the present disclosure, since the silicon-based semiconductor material or the oxide-based semiconductor material is transparent, transmittance can be prevented from being lost due to the first etch stop layer ES1, the second etch stop layer ES2 and the third etch stop layer ES3.

In another embodiment, the first etch stop layer ES1, the second etch stop layer ES2 and the third etch stop layer ES3 can include a transparent conductive material (TCO) such as ITO or IZO. Therefore, the transparent display panel 110 according to one embodiment of the present disclosure can prevent transmittance from being lost due to the first etch stop layer ES1, the second etch stop layer ES2 and the third etch stop layer ES3. In addition, in the transparent display panel 110 according to one embodiment of the present disclosure, since a transparent metal material such as ITO or IZO has a very low etch rate for an etchant such as BOE, the transparent display panel 110 can have a high anti-etching effect.

In one embodiment, the first etch stop layer ES1, the second etch stop layer ES2 and the third etch stop layer ES3 can be formed of the same material on the same layer as one of the elements provided in the non-transmissive area NTA. For example, the first etch stop layer ES1, the second etch stop layer ES2 and the third etch stop layer ES3 can be formed of the same material on the same layer as the active layer ACT1 of the driving transistor DTR provided in the non-transmissive area NTA. For another example, when the active layer ACT1 of the driving transistor DTR is formed of a first layer and a second layer, the first etch stop layer ES1, the second etch stop layer ES2 and the third etch stop layer ES3 can be formed of the same material on the same layer as one of the first layer and the second layer of the active layer ACT1 of the driving transistor DTR. For another example, a metal layer made of a transparent metal material such as ITO or IZO can be provided between the buffer film BF and the interlayer insulating layer ILD in the non-transmissive area NTA, and a circuit line can be provided in the metal layer. The first etch stop layer ES1, the second etch stop layer ES2 and the third etch stop layer ES3 can be formed of the same material on the same layer as the metal layer.

Since the transparent display panel 110 according to one embodiment of the present disclosure does not require a separate process for forming the first etch stop layer ES1, the second etch stop layer ES2 and the third etch stop layer ES3, process optimization can be implemented, and production energy can be reduced.

In the transparent display panel 110 according to one embodiment of the present disclosure, the etch stop layer ES can be disposed between the signal line crossing the first undercut structure UC1 and the first undercut structure UC1, so that the etchant can be prevented from flowing into the buffer film BF below the undercuts UC11 and UC12 when the first undercut structure UC1 is formed. Therefore, the transparent display panel 110 according to one embodiment of the present disclosure can prevent the signal line crossing the first undercut structure UC1 from being exposed and further prevent the signal line from being short-circuited with the cathode electrode CE below the first undercut structure UC1.

In FIGS. 7 to 9, each of the first etch stop layer ES1, the second etch stop layer ES2 and the third etch stop layer ES3 is patterned with a minimum area in the undercuts UC11 and UC12, but is not limited thereto.

Figure 12:
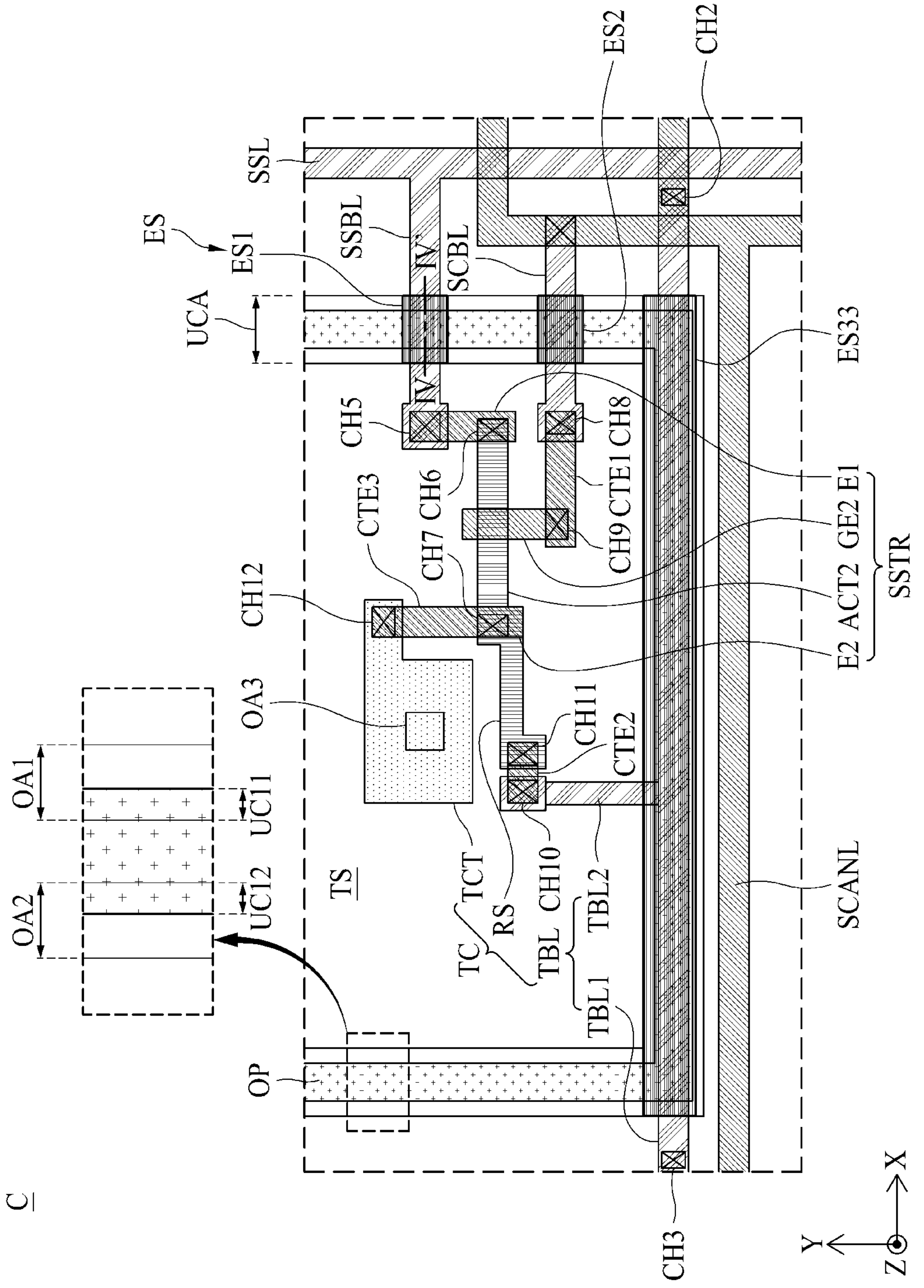
FIG. 12 is a view illustrating another example of a sensing transistor, a touch connection portion and an etch stop layer, which are provided in an area 'C' of FIG. 3 according to one embodiment.
Figure 13:
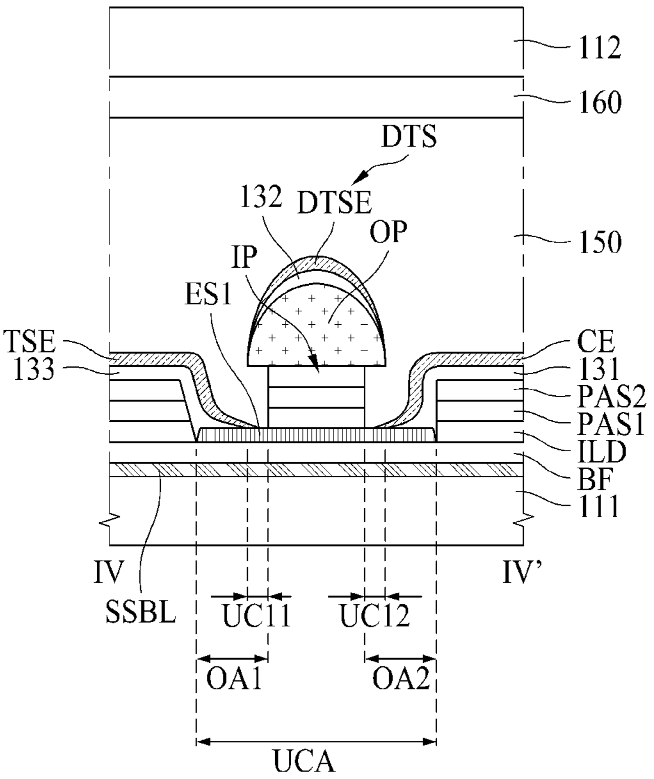
FIG. 13 is a cross-sectional view illustrating an example of line IV-IV' of FIG. 12 according to one embodiment.

FIG. 12 is a view illustrating another example of a sensing transistor, a touch connection portion and an etch stop layer, which are provided in an area C of FIG. 3 according to one embodiment, and FIG. 13 is a cross-sectional view illustrating an example of line IV-IV' of FIG. 12 according to one embodiment.

The transparent display panel 110 according to another embodiment of the present disclosure, which is shown in FIGS. 12 and 13, only differs from the transparent display panel 110 according to one embodiment of the present disclosure, which is shown in FIGS. 7 to 9, in the etch stop layer ES, and its other elements are substantially the same as those of the transparent display panel 110 shown in FIGS. 7 to 9. Hereinafter, only the etch stop layer ES according to another embodiment of the present disclosure will be described, and the substantially same elements will be omitted.

In the transparent display panel 110 according to another embodiment of the present disclosure, the etch stop layer ES can be disposed between the first undercut structure UC1 and the signal line crossing the first undercut structure UC1. The signal line can include a touch bridge TBL connecting the touch sensor TS with the touch line TL. In addition, the signal line can further include at least one of a sensing bridge line SSBL connecting the sensing transistor SSTR with the sensing line SSL or a scan bridge line SCBL connecting the sensing transistor SSTR with the scan line SCANL when the sensing transistor SSTR is provided to overlap the touch sensor TS.

In the transparent display panel 110 according to another embodiment of the present disclosure, the etch stop layer ES can be disposed between the touch bridge line TBL, the sensing bridge line SSBL or the scan bridge line SCBL and the first undercut structure UC1. The etch stop layer ES can be provided on the upper surface of the buffer film BF in the area in which the touch bridge line TBL, the sensing bridge line SSBL or the scan bridge line SCBL is formed, so that the buffer film BF can be prevented from being etched due to over-etching of the etchant when the first undercut structure UC1 is formed.

As shown in FIG. 12, the etch stop layer ES can include a first etch stop layer ES1, a second etch stop layer ES2 and a third etch stop layer ES3.

The first etch stop layer ES1 can be provided to at least partially overlap the sensing bridge line SSBL in the area UCA in which the first undercut structure UC1 is formed. In detail, the first etch stop layer ES1 can be provided between the first undercut structure UC1 and the sensing bridge line SSBL in the area UCA in which the first undercut structure UC1 is formed.

The first etch stop layer ES1 can be formed as one pattern in the area UCA in which the first undercut structure UC1 is formed. The first etch stop layer ES1 can be provided in an area overlapped with the sensing bridge line SSBL in the area UCA in which the first undercut structure UC1 is formed. The first etch stop layer ES1 can be provided between the inorganic patterns IP of the first undercut structure UC1 and the buffer film BF, and at least a portion of the upper surface of the first etch stop layer ES1 can be exposed from the first opening area OA1 and the second opening area OA2. The first etch stop layer ES1 can be provided in an area other than the area overlapped with the undercuts UC11 and UC12 in the first and second opening areas OA1 and OA2. In one embodiment, as shown in FIG. 13, the first etch stop layer ES1 can be provided in the entire area of the first and second opening areas OA1 and OA2.

In the transparent display panel 110 according to another embodiment of the present disclosure, the first etch stop layer ES1 can be widely provided in the area UCA in which the first undercut structure UC1 is formed, so that the first etch stop layer ES1 can protect the buffer film BF and the sensing bridge line SSBL from the etchant in the entire area exposed to the etchant. Also, the transparent display panel 110 according to another embodiment of the present disclosure can ensure that the first etch stop layer ES1 is disposed below the undercuts UC11 and UC12 even though a process error occurs.

The second etch stop layer ES2 can be provided to at least partially overlap the scan bridge line SCBL in the area UCA in which the first undercut structure UC1 is formed. In detail, the second etch stop layer ES2 can be provided between the first undercut structure UC1 and the scan bridge line SCBL in the area UCA in which the first undercut structure UC1 is formed.

The second etch stop layer ES2 can be formed as one pattern in the area UCA in which the first undercut structure UC1 is formed. The second etch stop layer ES2 can be provided in an area overlapped with the scan bridge line SCBL in the area UCA in which the first undercut structure UC1 is formed. The second etch stop layer ES2 can be provided between the inorganic patterns IP of the first undercut structure UC1 and the buffer film BF, and at least a portion of the upper surface of the second etch stop layer ES2 can be exposed from the first opening area OA1 and the second opening area OA2. The second etch stop layer ES2 can be provided in an area other than the area overlapped with the undercuts UC11 and UC12 in the first and second opening areas OA1 and OA2. In one embodiment, the second etch stop layer ES2 can be provided in the entire area of the first and second opening areas OA1 and OA2.

In the transparent display panel 110 according to another embodiment of the present disclosure, the second etch stop layer ES2 can be widely provided in the area UCA in which the first undercut structure UC1 is formed, so that the second etch stop layer ES2 can protect the buffer film BF and the scan bridge line SCBL from the etchant in the entire area exposed to the etchant. Also, the transparent display panel 110 according to another embodiment of the present disclosure can ensure that the second etch stop layer ES2 is disposed below the undercuts UC11 and UC12 even though a process error occurs.

The third etch stop layer ES3 can be provided to at least partially overlap the touch bridge line TBL in the area UCA in which the first undercut structure UC1 is formed. In detail, the third etch stop layer ES3 can be provided between the first undercut structure UC1 and the touch bridge line TBL in the area UCA in which the first undercut structure UC1 is formed.

The third etch stop layer ES3 can be formed as one pattern in the area UCA in which the first undercut structure UC1 is formed. The third etch stop layer ES3 can be provided in an area overlapped with the touch bridge line TBL in the area UCA in which the first undercut structure UC1 is formed. As shown in FIG. 12, the touch bridge line TBL can be disposed so that the first touch bridge line TBL1 extended in the second direction (e.g., X-axis direction) overlaps the area UCA in which the first undercut structure UC1 is formed. In this case, the third etch stop layer ES3 can be formed as a single line pattern extended in the second direction (e.g., X-axis direction) in the area UCA in which the first undercut structure UC1 is formed.

The third etch stop layer ES3 can be provided between the inorganic patterns IP of the first undercut structure UC1 and the buffer film BF, and at least a portion of the upper surface of the third etch stop layer ES3 can be exposed from the first opening area OA1 and the second opening area OA2. The third etch stop layer ES3 can be provided in an area other than the area overlapped with the undercuts UC11 and UC12 in the first and second opening areas OA1 and OA2. In one embodiment, the third etch stop layer ES3 can be provided in the entire area of the first and second opening areas OA1 and OA2.

In the transparent display panel 110 according to another embodiment of the present disclosure, the third etch stop layer ES3 can be widely provided in the area UCA in which the first undercut structure UC1 is formed, so that the third etch stop layer ES3 can protect the buffer film BF and the touch bridge line TBL from the etchant in the entire area exposed to the etchant. Also, the transparent display panel 110 according to another embodiment of the present disclosure can ensure that the third etch stop layer ES3 is disposed below the undercuts UC11 and UC12 even though a process error occurs.

As described above, the first etch stop layer ES1, the second etch stop layer ES2 and the third etch stop layer ES3, which are widely provided in the area UCA where the first undercut structure UC1 is formed, can be formed of a non-conductive material rather than a conductive material. The etch stop layer ES according to another embodiment of the present disclosure can be formed to be wide in the area UCA where the first undercut structure UC1 is formed, so that the etch stop layer ES can be in contact with the touch sensor electrode TSE in the first opening area OA1 and in contact with the cathode electrode CE in the second opening area OA2. In this case, when the etch stop layer ES is formed of a conductive material, a short circuit can occur between the touch sensor electrode TSE and the cathode electrode CE.

The etch stop layer ES according to another embodiment of the present disclosure can be made of a non-conductive material so that a short circuit does not occur between the touch sensor electrode TSE and the cathode electrode CE.

In one embodiment, the first etch stop layer ES1, the second etch stop layer ES2 and the third etch stop layer ES3 can include a silicon-based semiconductor material or an oxide-based semiconductor material. For example, the first etch stop layer ES1, the second etch stop layer ES2 and the third etch stop layer ES3 can include indium gallium zinc oxide (IGZO). In the transparent display panel 110 according to another embodiment of the present disclosure, since the silicon-based semiconductor material or the oxide-based semiconductor material is transparent, transmittance can be prevented from being lost due to the first etch stop layer ES1, the second etch stop layer ES2 and the third etch stop layer ES3.

In another embodiment, the first etch stop layer ES1, the second etch stop layer ES2 and the third etch stop layer ES3 can be formed of the same material on the same layer as one of the elements formed in the non-transmissive area NTA. For example, the first etch stop layer ES1, the second etch stop layer ES2 and the third etch stop layer ES3 can be formed of the same material on the same layer as the active layer ACT1 of the driving transistor DTR formed in the non-transmissive area NTA. For another example, when the active layer ACT1 of the driving transistor DTR is formed of a first layer and a second layer, the first etch stop layer ES1, the second etch stop layer ES2 and the third etch stop layer ES3 can be formed of the same material on the same layer as one, which is made of a non-conductive material, of the first layer and the second layer of the active layer ACT1 of the driving transistor DTR. Since the transparent display panel 110 according to another embodiment of the present disclosure does not require a separate process for forming the first etch stop layer ES1, the second etch stop layer ES2 and the third etch stop layer ES3, process optimization can be implemented, and production energy can be reduced.

Figure 14:
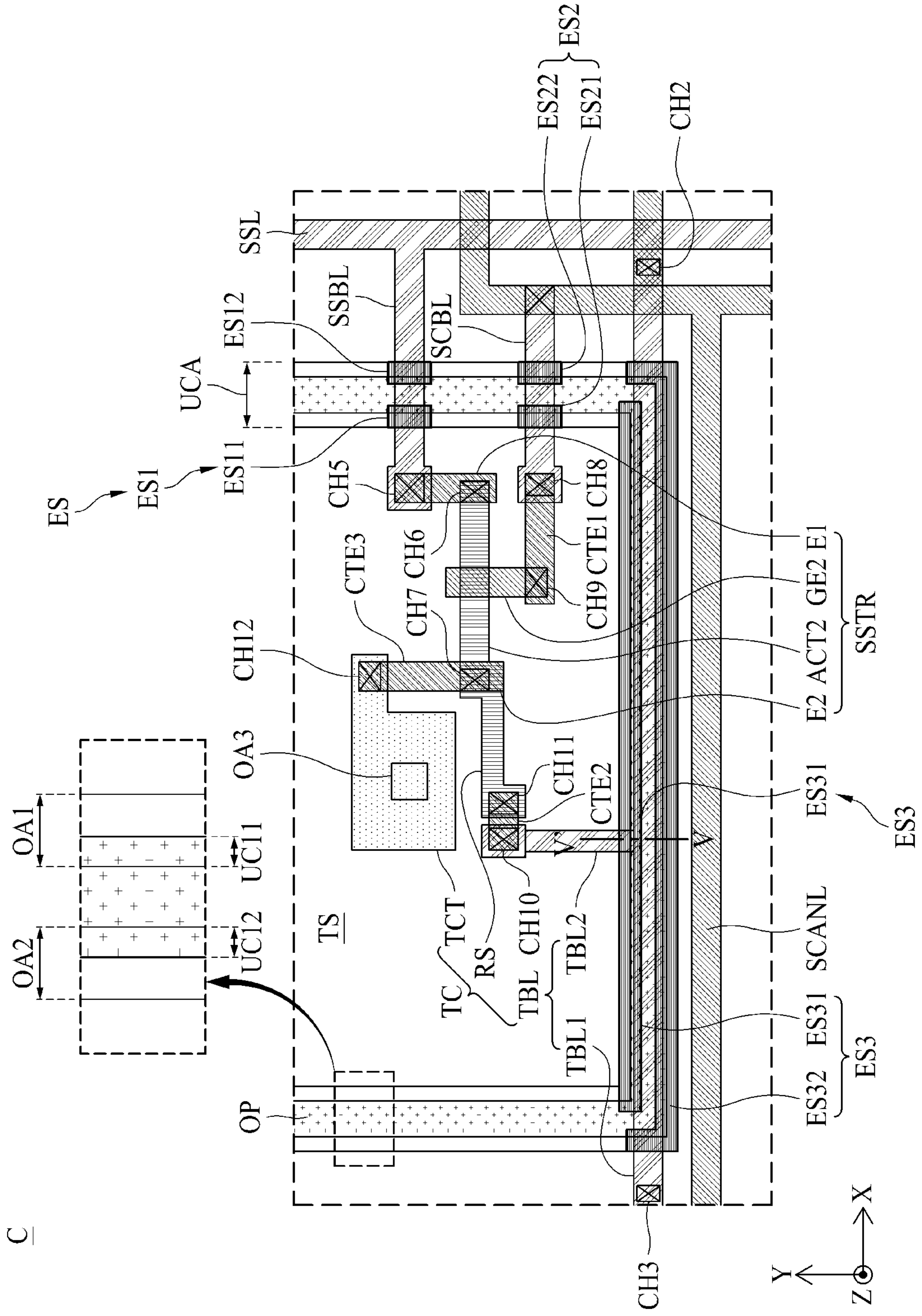
FIG. 14 is a view illustrating still another example of a sensing transistor, a touch connection portion and an etch stop layer, which are provided in an area 'C' of FIG. 3 according to one embodiment.
Figure 15:
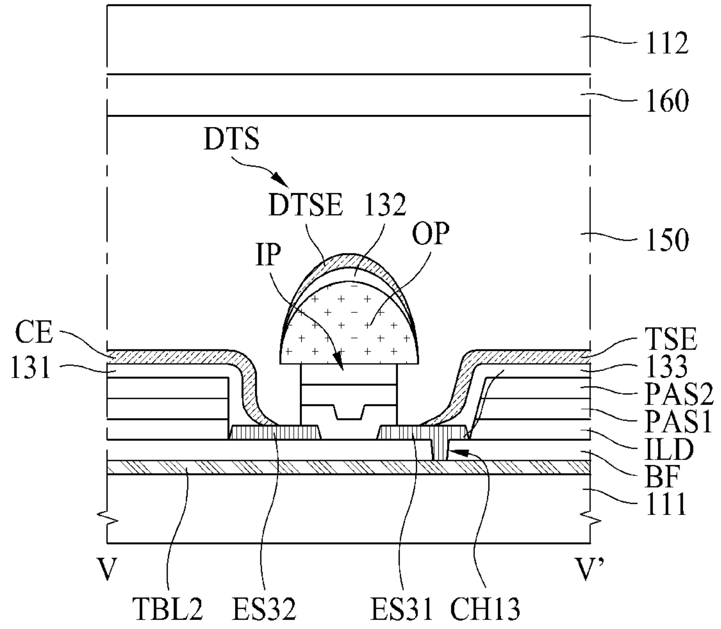
FIG. 15 is a cross-sectional view illustrating an example of line V-V' of FIG. 14 according to one embodiment.
Figure 16:
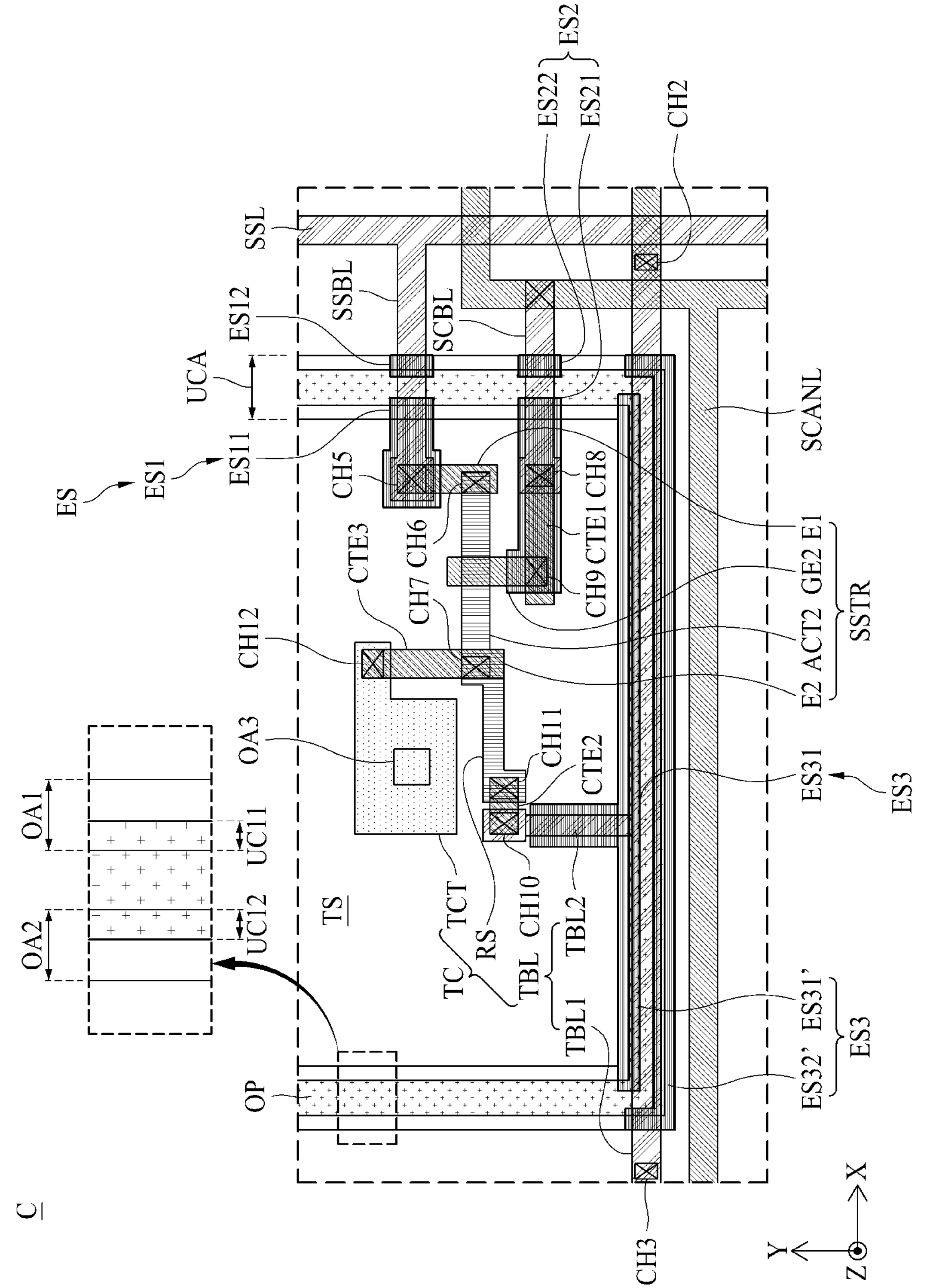
FIG. 16 is a view illustrating further still another example of a sensing transistor, a touch connection portion and an etch stop layer, which are provided in an area 'C' of FIG. 3 according to one embodiment.

FIG. 14 is a view illustrating still another example of a sensing transistor, a touch connection portion and an etch stop layer, which are provided in an area C of FIG. 3 according to one embodiment, FIG. 15 is a cross-sectional view illustrating an example of line V-V' of FIG. 14 according to one embodiment, and FIG. 16 is a view illustrating further still another example of a sensing transistor, a touch connection portion and an etch stop layer, which are provided in an area C of FIG. 3 according to one embodiment.

The transparent display panel 110 according to still another embodiment of the present disclosure, which is shown in FIGS. 14 and 15 only differs from the transparent display panel 110 according to one embodiment of the present disclosure, which is shown in FIGS. 7 to 9 in the etch stop layer ES, and its other elements are substantially the same as those of the transparent display panel 110 shown in FIGS. 7 to 9. Hereinafter, only the etch stop layer ES according to still another embodiment of the present disclosure will be described, and the substantially same elements will be omitted.

In the transparent display panel 110 according to still another embodiment of the present disclosure, the etch stop layer ES can be disposed between the first undercut structure UC1 and the signal line crossing the first undercut structure UC1. The signal line can include a touch bridge TBL connecting the touch sensor TS with the touch line TL. In addition, the signal line can further include at least one of a sensing bridge line SSBL connecting the sensing transistor SSTR with the sensing line SSL or a scan bridge line SCBL connecting the sensing transistor SSTR with the scan line SCANL when the sensing transistor SSTR is provided to overlap the touch sensor TS.

In the transparent display panel 110 according to still another embodiment of the present disclosure, the etch stop layer ES can be disposed between the touch bridge line TBL, the sensing bridge line SSBL or the scan bridge line SCBL and the first undercut structure UC1. The etch stop layer ES can be provided on the upper surface of the buffer film BF in the area in which the touch bridge line TBL, the sensing bridge line SSBL or the scan bridge line SCBL is formed, so that the buffer film BF can be prevented from being etched due to over-etching of the etchant when the first undercut structure UC1 is formed.

The etch stop layer ES according to still another embodiment of the present disclosure can be made of a conductive material unlike the etch stop layer ES shown in FIGS. 12 and 13. In detail, as shown in FIG. 14, the etch stop layer ES can include a first etch stop layer ES1, a second etch stop layer ES2 and a third etch stop layer ES3.

In one embodiment, the first etch stop layer ES1, the second etch stop layer ES2 and the third etch stop layer ES3 can be formed of a material made by conductorization of a silicon-based semiconductor material or an oxide-based semiconductor material (e.g., conductorized silicon-based semiconductor material or conductorized oxide-based semiconductor material). For example, the first etch stop layer ES1, the second etch stop layer ES2 and the third etch stop layer ES3 can be formed of a material made by conductorization of indium gallium zinc oxide (IGZO). In the transparent display panel 110 according to still another embodiment of the present disclosure, since the silicon-based semiconductor material or the oxide-based semiconductor material is transparent, transmittance can be prevented from being lost due to the first etch stop layer ES1, the second etch stop layer ES2 and the third etch stop layer ES3.

In another embodiment, the first etch stop layer ES1, the second etch stop layer ES2 and the third etch stop layer ES3 can include a transparent conductive material (TCO) such as ITO or IZO. Therefore, the transparent display panel 110 according to still another embodiment of the present disclosure can prevent transmittance from being lost due to the first etch stop layer ES1, the second etch stop layer ES2 and the third etch stop layer ES3. In addition, in the transparent display panel 110 according to still another embodiment of the present disclosure, since a transparent metal material such as ITO or IZO has a very low etch rate for an etchant such as BOE, the transparent display panel 110 can have a high anti-etching effect.

In one embodiment, the first etch stop layer ES1, the second etch stop layer ES2 and the third etch stop layer ES3 can be formed of the same material on the same layer as one of the elements formed in the non-transmissive area NTA. For example, the first etch stop layer ES1, the second etch stop layer ES2 and the third etch stop layer ES3 can be formed of the same material on the same layer as the active layer ACT1 of the driving transistor DTR formed in the non-transmissive area NTA. At this time, when the material constituting the active layer ACT1 is a semiconductor material, conductorization can be performed. For another example, when the active layer ACT1 of the driving transistor DTR is formed of a first layer and a second layer, the first etch stop layer ES1, the second etch stop layer ES2 and the third etch stop layer ES3 can be formed of the same material on the same layer as one, which is made of a conductive material, of the first layer and the second layer of the active layer ACT1 of the driving transistor DTR. For another example, a metal layer made of a transparent metal material such as ITO or IZO can be provided between the buffer film BF and the interlayer insulating layer ILD in the non-transmissive area NTA, and a circuit line can be provided in the metal layer. In this case, the first etch stop layer ES1, the second etch stop layer ES2 and the third etch stop layer ES3 can be formed of the same material on the same layer as the metal layer. Since the transparent display panel 110 according to still another embodiment of the present disclosure does not require a separate process for forming the first etch stop layer ES1, the second etch stop layer ES2 and the third etch stop layer ES3, process optimization can be implemented, and production energy can be reduced.

Meanwhile, when the transparent display panel 110 according to still another embodiment of the present disclosure forms the first etch stop layer ES1, the second etch stop layer ES2 and the third etch stop layer ES3 as one pattern, a short circuit can occur between the touch sensor electrode TSE and the cathode electrode CE. Therefore, the transparent display panel 110 according to still another embodiment of the present disclosure can form the first etch stop layer ES1, the second etch stop layer ES2 and the third etch stop layer ES3 as a plurality of patterns spaced apart from each other.

In detail, as shown in FIG. 14, the first etch stop layer ES1 can be provided to at least partially overlap the sensing bridge line SSBL in the area UCA in which the first undercut structure UC1 is formed. The first etch stop layer ES1 can be provided between the first undercut structure UC1 and the sensing bridge line SSBL in the area UCA in which the first undercut structure UC1 is formed.

The first etch stop layer ES1 can include a (1-1)th etch stop layer ES11 and a (1-2)th etch stop layer ES12. The (1-1)th etch stop layer ES11 can be patterned so that the organic insulating pattern OP overlaps the first undercut UC11 more protruded in the direction of the touch sensor TS than the plurality of inorganic insulating patterns IP. The (1-1)th etch stop layer ES11 can be provided below the lower surface of the organic insulating pattern OP protruded from the first opening area OA1.

The (1-1)th etch stop layer ES11 is provided between the inorganic patterns IP of the first undercut structure UC1 and the buffer film BF, and at least a portion of an upper surface thereof can be exposed from the first opening area OA1. The (1-1)th etch stop layer ES11 can be provided in an area other than the area overlapped with the undercut UC11 in the first opening area OA1. In one embodiment, the (1-1)th etch stop layer ES11 can be provided in the entire area of the first opening area OA1.

The (1-1)th etch stop layer ES11 can be provided on the upper surface of the buffer film BF overlapped with the sensing bridge line SSBL. In this case, the (1-1)th etch stop layer ES11 can be provided on the side of the sensing bridge line SSBL to prevent the buffer film BF covering the side of the sensing bridge line SSBL from being etched. In one embodiment, the (1-1)th etch stop layer ES11 can be also provided on the upper surface of the sensing bridge line SSBL to prevent the buffer film BF covering the upper surface of the sensing bridge line SSBL from being etched.

The (1-2)th etch stop layer ES12 can be disposed to be spaced apart from the (1-1)th etch stop layer ES11, and can be patterned so that the organic insulating pattern OP overlaps the second undercut UC12 more protruded in the direction of the non-transmissive area NTA than the plurality of inorganic insulating patterns IP. The (1-2)th etch stop layer ES12 can be provided below the lower surface of the organic insulating pattern OP protruded from the second opening area OA2. The (1-2)th etch stop layer ES12 may be provided between the inorganic patterns IP of the first undercut structure UC1 and the buffer film BF, and at least a portion of the upper surface thereof can be exposed from the second opening area OA2. The (1-2)th etch stop layer ES12 can be provided in an area other than the area overlapped with the undercut UC12 in the second opening area OA2. In one embodiment, the (1-2)th etch stop layer ES12 can be provided in the entire area of the second opening area OA2.

The (1-2)th etch stop layer ES12 can be provided on the upper surface of the buffer film BF overlapped with the sensing bridge line SSBL. In this case, the (1-2)th etch stop layer ES12 can be provided on the side of the sensing bridge line SSBL to prevent the buffer film BF covering the side of the sensing bridge line SSBL from being etched. In one embodiment, the (1-2)th etch stop layer ES12 can be also provided on the upper surface of the sensing bridge line SSBL to prevent the buffer film BF covering the upper surface of the sensing bridge line SSBL from being etched.

In the transparent display panel 110 according to still another embodiment of the present disclosure, the (1-1)th etch stop layer ES11 and the (1-2)th etch stop layer ES12 can be disposed to be spaced apart from each other with the inorganic insulating pattern IP interposed therebetween, so that a short circuit can be prevented from occurring between the touch sensor electrode TSE and the cathode electrode CE.

Also, in the transparent display panel 110 according to still another embodiment of the present disclosure, each of the (1-1)th etch stop layer ES11 and the (1-2)th etch stop layer ES12 can be widely provided in the area UCA in which the first undercut structure UC1 is formed, so that the first etch stop layer ES1 can protect the buffer film BF and the sensing bridge line SSBL from the etchant in the entire area exposed to the etchant. Also, the transparent display panel

110 according to still another embodiment of the present disclosure can ensure that the (1-1)th etch stop layer ES11 and the (1-2)th etch stop layer ES12 are disposed below the undercuts UC11 and UC12 even though a process error occurs.

The second etch stop layer ES2 can be provided to at least partially overlap the scan bridge line SCBL in the area UCA in which the first undercut structure UC1 is formed. The second etch stop layer ES2 can be provided between the first undercut structure UC1 and the scan bridge line SCBL in the area UCA in which the first undercut structure UC1 is formed.

The second etch stop layer ES2 can include a (2-1)th etch stop layer ES21 and a (2-2)th etch stop layer ES22 as much as the number of undercuts UC11 and UC12. The (2-1)th etch stop layer ES21 can be patterned so that the organic insulating pattern OP overlaps the first undercut UC11 more protruded in the direction of the touch sensor TS than the plurality of inorganic insulating patterns IP. The (2-1)th etch stop layer ES21 can be provided below the lower surface of the organic insulating pattern OP protruded from the first opening area OA1.

The (2-1)th etch stop layer ES21 can be provided between the inorganic patterns IP of the first undercut structure UC1 and the buffer film BF, and at least a portion of the upper surface of the (2-1)th etch stop layer ES21 can be exposed from the first opening area OA1. The (2-1)th etch stop layer ES21 can be provided in an area other than the area overlapped with the undercut UC11 in the first opening area OA1. In one embodiment, the (2-1)th etch stop layer ES21 can be provided in the entire area of the first opening area OA1.

The (2-1)th etch stop layer ES21 can be provided on the upper surface of the buffer film BF overlapped with the scan bridge line SCBL. In this case, the (2-1)th etch stop layer ES21 can be provided on the side of the scan bridge line SCBL to prevent the buffer film BF covering the side of the scan bridge line SCBL from being etched. In one embodiment, the (2-1)th etch stop layer ES21 can be also provided on the upper surface of the scan bridge line SCBL to prevent the buffer film BF covering the upper surface of the scan bridge line SCBL from being etched.

The (2-2)th etch stop layer ES22 can be patterned so that the organic insulating pattern OP overlaps the second undercut UC12 more protruded in the direction of the non-transmissive area NTA than the plurality of inorganic insulating patterns IP. The (2-2)th etch stop layer ES22 can be provided below the lower surface of the organic insulating pattern OP protruded from the second opening area OA2.

The (2-2)th etch stop layer ES22 can be provided between the inorganic patterns IP of the first undercut structure UC1 and the buffer film BF, and at least a portion of the upper surface of the (2-2)th etch stop layer ES22 can be exposed from the second opening area OA2. The (2-2)th etch stop layer ES22 can be provided in an area other than the area overlapped with the undercut UC12 in the second opening area OA2. In one embodiment, the (2-2)th etch stop layer ES22 can be provided in the entire area of the second opening area OA2.

The (2-2)th etch stop layer ES22 can be provided on the upper surface of the buffer film BF overlapped with the scan bridge line SCBL. In this case, the (2-2)th etch stop layer ES22 can be provided on the side of the scan bridge line SCBL to prevent the buffer film BF covering the side of the scan bridge line SCBL from being etched. In one embodiment, the (2-2)th etch stop layer ES22 can be also provided on the upper surface of the scan bridge line SCBL to prevent the buffer film BF covering the upper surface of the scan bridge line SCBL from being etched.

In the transparent display panel 110 according to still another embodiment of the present disclosure, the (2-1)th etch stop layer ES21 and the (2-2)th etch stop layer ES22 can be disposed to be spaced apart from each other with the inorganic insulating pattern IP interposed therebetween, so that a short circuit can be prevented from occurring between the touch sensor electrode TSE and the cathode electrode CE.

Also, in the transparent display panel 110 according to still another embodiment of the present disclosure, each of the (2-1)th etch stop layer ES21 and the (2-2)th etch stop layer ES22 can be widely provided in the area UCA in which the first undercut structure UC1 is formed, so that the first etch stop layer ES1 can protect the buffer film BF and the scan bridge line SCBL from the etchant in the entire area exposed to the etchant. Also, the transparent display panel 110 according to still another embodiment of the present disclosure can ensure that the (2-1)th etch stop layer ES21 and the (2-2)th etch stop layer ES22 are disposed below the undercuts UC11 and UC12 even though a process error occurs.

As shown in FIG. 14, the third etch stop layer ES3 can be provided to at least partially overlap the touch bridge line TBL in the area UCA in which the first undercut structure UC1 is formed. The third etch stop layer ES3 can be provided between the first undercut structure UC1 and the touch bridge line TBL in the area UCA in which the first undercut structure UC1 is formed.

The touch bridge line TBL can be provided so that the first touch bridge line TBL1 extended in the second direction (e.g., X-axis direction) overlaps the area UCA in which the first undercut structure UC1 is formed. In this case, the third etch stop layer ES3 can include a (3-1)th etch stop layer ES31 and a (3-2)th etch stop layer ES32.

The (3-1)th etch stop layer ES31 can be patterned so that the organic insulating pattern OP overlaps the first undercut UC11 more protruded in the direction of the touch sensor TS than the plurality of inorganic insulating patterns IP. The (3-1)th etch stop layer ES31 can be provided below the lower surface of the organic insulating pattern OP protruded from the first opening area OA1.

The (3-1)th etch stop layer ES31 can be provided between the inorganic patterns IP of the first undercut structure UC1 and the buffer film BF, and at least a portion of the upper surface of the (3-1)th etch stop layer ES31 can be exposed from the first opening area OA1. The (3-1)th etch stop layer ES31 can be provided in an area other than the area overlapped with the undercut UC11 in the first opening area OA1. In one embodiment, the (3-1)th etch stop layer ES31 can be provided in the entire area of the first opening area OA1. In one embodiment, the (3-1)th etch stop layer ES31 can be provided as a line pattern elongated along a longitudinal direction of the first touch bridge line TBL1.

The (3-1)th etch stop layer ES31 can be provided on the upper surface of the buffer film BF overlapped with the touch bridge line TBL. In this case, the (3-1)th etch stop layer ES31 can be provided on the side of the touch bridge line TBL to prevent the buffer film BF covering the side of the touch bridge line TBL from being etched. In one embodiment, the (3-1)th etch stop layer ES31 can be also provided on the upper surface of the scan bridge line SCBL to prevent the buffer film BF covering the upper surface of the scan bridge line SCBL from being etched.

The (3-2)th etch stop layer ES32 can be patterned so that the organic insulating pattern OP overlaps the second undercut UC12 more protruded in the direction of the non-transmissive area NTA than the plurality of inorganic insulating patterns IP. The (3-2)th etch stop layer ES32 can be provided below the lower surface of the organic insulating pattern OP protruded from the second opening area OA2.

The (3-2)th etch stop layer ES32 can be provided between the inorganic patterns IP of the first undercut structure UC1 and the buffer film BF, and at least a portion of the upper surface of the (3-2)th etch stop layer ES32 can be exposed from the second opening area OA2. The (3-2)th etch stop layer ES32 can be provided in an area other than the area overlapped with the undercut UC12 in the second opening area OA2. In one embodiment, the (3-2)th etch stop layer ES32 can be provided in the entire area of the second opening area OA2. In one embodiment, the (3-2)th etch stop layer ES32 can be provided as a line pattern elongated along the longitudinal direction of the first touch bridge line TBL1. As shown in FIG. 14, the (3-2)th etch stop layer ES32 can be protruded to overlap one side of the first touch bridge line TBL1, which is disposed in the undercut area UCA, at one end of the line pattern. In addition, the (3-2)th etch stop layer ES32 can be protruded to overlap the other side of the first touch bridge line TBL1, which is disposed in the undercut area UCA, at the other end of the line pattern.

The (3-2)th etch stop layer ES32 can be provided on the upper surface of the buffer film BF overlapped with the touch bridge line TBL. In this case, the (3-2)th etch stop layer ES32 can be provided on the side of the touch bridge line TBL to prevent the buffer film BF covering the side of the touch bridge line TBL from being etched. In one embodiment, the (3-2)th etch stop layer ES32 can be also provided on the upper surface of the touch bridge line TBL to prevent the buffer film BF covering the upper surface of the touch bridge line TBL from being etched.

In the transparent display panel 110 according to still another embodiment of the present disclosure, the etch stop layer ES can be formed of a conductive material. In the transparent display panel 110 according to still another embodiment of the present disclosure, the touch sensor electrode TSE can be in contact with the etch stop layer ES, so that an area of the touch sensor TS can be increased, whereby touch performance can be improved.

Further, in the transparent display panel 110 according to still another embodiment of the present disclosure, as shown in FIG. 15, the (3-1)th etch stop layer ES31 can be electrically connected to the touch bridge line TBL through a thirteenth contact hole CH13. Therefore, the (3-1)th etch stop layer ES31 can be more stably connected to the touch sensor electrode TSE through the touch bridge line TBL.

Also, in the transparent display panel 110 according to still another embodiment of the present disclosure, the etch stop layer ES can be formed as two patterns spaced apart from each other, so that a short circuit can be prevented from occurring between the touch sensor electrode TSE and the cathode electrode CE.

Meanwhile, in FIGS. 14 and 15, the etch stop layer ES is disposed only in the area in which the first undercut structure UC1 is formed, but is not necessarily limited thereto.

In another embodiment, as shown in FIG. 16, the etch stop layer ES can be extended to the area overlapped with the touch sensor TS. In detail, the (1-1)th etch stop layer ES11 can be extended to the area overlapped with the touch sensor TS along the sensing bridge line SSBL in the area in which the first undercut structure UC1 is formed. The (2-1)th etch stop layer ES21 can be extended to the area overlapped with the touch sensor TS along the scan bridge line SCBL in the area in which the first undercut structure UC1 is formed. In addition, the (3-1)th etch stop layer ES31 can be extended to the area overlapped with the touch sensor TS along the touch bridge line TBL in the area in which the first undercut structure UC1 is formed.

In the transparent display panel 110 according to still another embodiment of the present disclosure, the etch stop layer ES can be extended to the area overlapped with the touch sensor TS to make sure of the area of the touch sensor TS as large as possible. Also, in the transparent display panel 110 according to still another embodiment of the present disclosure, the etch stop layer ES can be provided on only the signal line in the area overlapped with the touch sensor TS, whereby transparency loss can be minimized.

According to the present disclosure, the following advantageous effects can be obtained.

In the present disclosure, the touch sensor electrode of the touch sensor and the cathode electrode of the light emitting element can be simultaneously formed using the undercut structure, whereby the touch process can be simplified and a separate mask for the touch sensor electrode is not required additionally. Therefore, the present disclosure can implement process optimization and reduce production energy.

Also, in the present disclosure, the defective touch sensor can be detected using the sensing transistor. Therefore, the present disclosure can reduce a touch defect rate and improve a touch recognition rate.

Also, in the present disclosure, the etch stop layer can be disposed between the undercut structure and the signal line crossing the undercut structure to prevent the etchant from flowing into the buffer film when the undercut structure is formed. Therefore, the signal line crossing the undercut structure can be prevented from being exposed, and the signal line can be prevented from being short-circuited with the cathode electrode below the undercut structure.

Also, in the present disclosure, the etch stop layer is widely formed in the area in which the undercut structure is formed, so that the etch stop layer can protect the buffer film and the sensing bridge line from the etchant in the entire area exposed to the etchant. Also, the present disclosure can ensure that the etch stop layer is disposed below the undercut even though a process error occurs.

Also, in the present disclosure, the etch stop layer can be formed of the same material on the same layer as one of the elements formed in the non-transmissive area. Therefore, since the present disclosure does not require a separate process for forming the etch stop layer, process optimization can be implemented and production energy can be reduced.

Also, in the present disclosure, the etch stop layer is formed of a conductive material, so that the area of the touch sensor can be increased, whereby touch performance can be improved.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A transparent display device comprising:

a substrate including a transmissive area and a non-transmissive area that is less transmissive of external light than the transmissive area;

a plurality of subpixels in the non-transmissive area, a subpixel from the plurality of subpixels including a light emitting element that comprises an anode electrode, a light emitting layer on the anode electrode, and a cathode electrode on the light emitting layer;

a touch sensor in the transmissive area, the touch sensor including a touch sensor electrode in the transmissive area;

a first undercut structure between the cathode electrode of the light emitting element and the touch sensor electrode of the touch sensor such that the cathode electrode is disconnected from the touch sensor electrode;

a signal line between the first undercut structure and the substrate; and an etch stop layer between the signal line and the first undercut structure, wherein the first undercut structure includes:

a plurality of inorganic patterns including a first opening area at a first side of the plurality of inorganic patterns;

an organic pattern over the plurality of inorganic patterns and a first portion of the organic pattern extending past a first end of the plurality of inorganic patterns and at least partially overlapping the first opening area; and an undercut in a first area where the first portion of the organic pattern and the first opening area overlap each other, and wherein the etch stop layer at least partially overlaps the undercut.

2. The transparent display device of claim 1, wherein the cathode electrode and the touch sensor electrode are on a same layer and separated from each other by the first undercut structure.

3. The transparent display device of claim 1, wherein the first undercut structure has a closed shape in a plane view within the transmissive area.

4. The transparent display device of claim 1, further comprising:

a buffer film between the plurality of inorganic patterns and the signal line, wherein the etch stop layer contacts an upper surface of the buffer film that is overlapped by the first opening area.

5. The transparent display device of claim 1, wherein the plurality of inorganic patterns further include a second opening area at a second side of the plurality of inorganic patterns, wherein the first opening area is between the plurality of inorganic patterns and the touch sensor and the second opening area is between the plurality of inorganic patterns and the plurality of subpixels, wherein a second portion of the organic pattern extends past a second end of the plurality of inorganic patterns and at least partially overlaps the second opening area, and the undercut is a second area where the second portion of the organic pattern and the second opening area overlap.

6. The transparent display device of claim 5, wherein the etch stop layer at least partially overlaps the first opening area and the second opening area.

7. The transparent display device of claim 5, wherein the signal line overlaps the first opening area and the second opening area.

8. The transparent display device of claim 5, wherein the etch stop layer, the signal line, and the touch sensor electrode overlap each other.

9. The transparent display device of claim 5, wherein the etch stop layer includes a first etch stop layer at least partially overlapping the first opening area and a second etch stop layer at least partially overlapping the second opening area.

10. The transparent display device of claim 9, wherein the first etch stop layer is in contact with the touch sensor electrode of the touch sensor in at least a portion of the first opening area, and the second etch stop layer is in contact with the cathode electrode of the light emitting element in at least a portion of the second opening area.

11. The transparent display device of claim 1, wherein each of the plurality of subpixels further comprises:

a driving transistor including an active layer, a gate electrode, a source electrode, and a drain electrode; and wherein the etch stop layer comprises a same material and is on a same layer as the active layer of the driving transistor.

12. The transparent display device of claim 1, wherein the etch stop layer includes a conductorized silicon-based semiconductor material or a conductorized oxide-based semiconductor material.

13. The transparent display device of claim 1, wherein the etch stop layer includes a transparent conductive material.

14. The transparent display device of claim 1, further comprising:

a touch line in the non-transmissive area, wherein the signal line includes a touch bridge line electrically connecting the touch line and the touch sensor.

15. The transparent display device of claim 14, wherein the touch bridge line is connected to the touch line in the non-transmissive area, and extends across the first undercut structure to an area that overlaps the touch sensor.

16. The transparent display device of claim 1, further comprising:

a sensing transistor overlapping the touch sensor, the sensing transistor configured to sense a voltage of the touch sensor;

a sensing line in the non-transmissive area; and a scan line in the non-transmissive area, the scan line configured to supply a scan signal, wherein the signal line includes a sensing bridge line connecting the sensing transistor and the sensing line, and a scan bridge line connecting the sensing transistor and the scan line.

17. The transparent display device of claim 16, wherein the sensing transistor is turned on responsive to the scan signal and transfers a voltage of the touch sensor, to the sensing line through the sensing bridge line.

18. The transparent display device of claim 1, further comprising:

a driving transistor provided in the subpixel from the plurality of subpixels; and a light shielding layer between the substrate and the driving transistor, wherein the signal line is on a same layer as the light shielding layer.

19. The transparent display device of claim 1, further comprising:

a touch line in the non-transmissive area;

a touch connection portion connecting the touch line and the touch sensor; and a sensing transistor overlapping the touch sensor, the sensing transistor configured to sense a voltage of the touch sensor, wherein the sensing transistor is electrically connected to the touch sensor through the touch connection portion.

20. The transparent display device of claim 19, wherein the touch connection portion includes a resistance line comprising a silicon-based semiconductor material or an oxide-based semiconductor material.

21. The transparent display device of claim 19, wherein the touch connection portion includes a touch contact electrode connected to the touch sensor electrode in the transmissive area.

22. The transparent display device of claim 21, wherein the touch sensor electrode is in contact with an upper surface of the touch contact electrode that is overlapped by a second undercut structure.

23. A transparent display device comprising:

a substrate including a transmissive area and a non-transmissive area that is less transmissive of external light than the transmissive area;

a plurality of insulating layers in the non-transmissive area and the transmissive area, the plurality of insulating layers including an opening in the non-transmissive area;

a light emitting element on the plurality of insulating layers in the non-transmissive area, the light emitting element including an anode electrode, an organic light emitting layer on the anode electrode, and a cathode electrode on the organic light emitting layer, the cathode electrode extending from the non-transmissive area to the opening in the plurality of insulating layers in the non-transmissive area;

a touch sensor including a touch sensor electrode that is on the plurality of insulating layers in the transmissive area, the touch sensor electrode extending to the opening in the plurality of insulating layers in the non-transmissive area;

an etch stop layer in the opening;

an undercut structure at least partially on the etch stop layer in the opening, the undercut structure separating the touch sensor electrode in the opening from the cathode electrode in the opening; and a signal line that is between the etch stop layer and the substrate and at least partially overlaps the opening.

24. The transparent display device of claim 23, wherein the undercut structure includes:

a plurality of inorganic patterns in the opening, the plurality of inorganic patterns having a first width;

an organic pattern over the plurality of inorganic patterns, the organic pattern having a second width that is wider than the first width such that ends of the organic pattern extend past ends of the plurality of inorganic patterns, wherein the etch stop layer at least partially overlaps the ends of the organic pattern that extend past the ends of the plurality of inorganic patterns.

25. The transparent display device of claim 24, wherein the opening comprises a first opening at a first side of the plurality of inorganic patterns and a second opening at a second side of the plurality of inorganic patterns, and the etch stop layer overlaps at least one of the first opening or the second opening.

26. The transparent display device of claim 25, wherein the signal line overlaps at least one of the first opening or the second opening.

27. The transparent display device of claim 23, wherein the touch sensor electrode and the cathode electrode contact the etch stop layer in the opening.

28. The transparent display device of claim 23, wherein the etch stop layer contacts the signal line.

29. The transparent display device of claim 23, further comprising:

a sensing transistor overlapping the touch sensor, the sensing transistor configured to sense a voltage of the touch sensor;

a sensing line in the non-transmissive area; and a scan line in the non-transmissive area, the scan line configured to supply a scan signal, wherein the signal line includes a sensing bridge line connecting the sensing transistor and the sensing line, and a scan bridge line connecting the sensing transistor and the scan line, wherein the sensing transistor is turned on responsive to the scan signal and transfers a voltage of the touch sensor, to the sensing line through the sensing bridge line.

* * * * *